(12) United States Patent
Asada

(10) Patent No.: US 6,239,496 B1
(45) Date of Patent: May 29, 2001

(54) PACKAGE HAVING VERY THIN SEMICONDUCTOR CHIP, MULTICHIP MODULE ASSEMBLED BY THE PACKAGE, AND METHOD FOR MANUFACTURING THE SAME

(75) Inventor: Junichi Asada, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/484,032

(22) Filed: Jan. 18, 2000

(30) Foreign Application Priority Data

Jan. 18, 1999 (JP) .................................................. 11-009763

(51) Int. Cl.⁷ .................................................. H01L 23/48
(52) U.S. Cl. .......................... 257/777; 257/685; 257/686; 257/723; 257/698
(58) Field of Search .................................. 257/723, 724, 257/777, 778, 685, 686, 698

(56) References Cited

U.S. PATENT DOCUMENTS

| | | | |
|---|---|---|---|
| 5,334,857 | * 8/1994 | Mennitt et al. | 257/48 |
| 5,376,825 | * 12/1994 | Tukamoto et al. | 257/685 |
| 5,468,997 | * 11/1995 | Imai et al. | 257/734 |
| 5,677,569 | * 10/1997 | Choi et al. | 257/686 |
| 5,726,493 | * 3/1998 | Yamashita et al. | 257/698 |
| 5,798,564 | * 8/1998 | Eng et al. | 257/686 |
| 6,013,948 | * 1/2000 | Akram et al. | 257/698 |
| 6,020,629 | * 2/2000 | Farnworth et al. | 257/686 |
| 6,028,365 | * 2/2000 | Akram et al. | 257/778 |
| 6,037,665 | * 3/2000 | Miyazaki | 257/773 |
| 6,051,886 | * 4/2000 | Fogal et al. | 257/777 |
| 6,051,887 | * 4/2000 | Hubbard | 257/777 |
| 6,087,717 | * 7/2000 | Ano et al. | 257/684 |

FOREIGN PATENT DOCUMENTS

| 8-236694 | 9/1996 | (JP) . |
|---|---|---|
| 11-145381 | 5/1999 | (JP) . |

* cited by examiner

Primary Examiner—Eddie C. Lee
Assistant Examiner—Lourdes Cruz
(74) Attorney, Agent, or Firm—Finnegan, Henderson, Farabow, Garrett & Dunner, L.L.P.

(57) ABSTRACT

A semiconductor package of this invention has an insulating substrates, wiring layers disposed on the surface of the insulating substrate, a semiconductor chip disposed in a device hole provided in the insulating substrate, inner-joint-conductors for connecting at least part of the bonding pads on the surface of the semiconductor chip to the corresponding inner-joint-conductors and connection lands connected to the wiring layers. The device hole is provided so that it goes through the center of the insulating substrate. The semiconductor chip is thinner than the insulating substrate. Then, this semiconductor chip is disposed in the device hole such that a bottom thereof is flush with a bottom plane of the insulating substrate. Further, this invention provides a MCM in which plural pieces of the thin semiconductor packages are laminated. In the MCM, the semiconductor packages are laminated such that top and bottom faces of the thin silicon chip are inverted. Predetermined connection lands are electrically connected to each other through a connecting conductor. This MCM has a high mechanical strength in its stacked structure and there is a low possibility that crack may occur in the package due to stress in the bending direction.

21 Claims, 15 Drawing Sheets

PACKAGE HAVING VERY THIN SEMICONDUCTOR CHIP, MULTICHIP MODULE ASSEMBLED BY THE PACKAGE, AND METHOD FOR MANUFACTURING THE SAME

BACKGROUND OF THE INVENTION

1. Field of the Invention

The present invention relates to a very thin semiconductor package mounting a very thin semiconductor chip, multichip module (MCM) in which plural pieces of the very thin semiconductor packages are laminated, and manufacturing method for the same very thin semiconductor package and MCM.

2. Description of the Related Art

FIG. 1 is a cross sectional view of a conventional MCM in which the semiconductor packages are laminated. This MCM has a structure in which two semiconductor packages are laminated by tape carrier package (TCP) architecture in a space having a restricted height. In the lower TCP, Cu wiring layers 104a, 104j are disposed on a polyimide film 101, which is an insulating substrate. End portions of the Cu wiring layers 104a, 104j are connected to inner leads 203a, 203j. The inner leads 203a, 203j are connected to bonding pads of a silicon chip 94. Further, the silicon chip 104 is bonded to the insulating substrate 101 with insulating adhesive (not shown). A top portion of the silicon chip 94 and the inner leads 203a, 203j are sealed with sealing resin layer 95 made of epoxy or the like. Cu wiring layers 105a, 105j are disposed on a surface of the polyimide film 102 on the upper TCP. End portions of the Cu wiring layers 105a, 105j are connected to inner leads 204a, 204j, and the inner leads 204a, 204j are bonded to bonding pads disposed on the silicon chip 96. Further, the silicon chip 96 is attached to the insulating substrate 102 with insulating adhesive (not shown). A top portion of the silicon chip 96 and the inner leads 204a, 204j are sealed by sealing resin layer 97. In such a conventional semiconductor package having upper/lower levels structure, the thickness of the silicon chips 94, 96 is about 200 μm. Thus, the thickness of each package is 350 μm to 500 μm. Therefore, the bending strength of the package is relatively high so that there is little possibility that the package may crack when bent.

There are increasing demands recently for reductions in thickness, geometrical size, weight and the like in the field of IC cards, portable information instruments or mobile multimedia applications and the like. However, because the height of the package from its mounting face of the MCM substrate is quite high, the MCM shown in FIG. 1 is not capable of satisfying the recent demands such as the reduction in thickness.

SUMMARY OF THE INVENTION

Accordingly, the present invention has been conceived to solve the above described problems and, therefore, it is an object of the invention is to provide a very thin semiconductor package suitable for a stacked structure, and strong against stress in a bending direction.

Another object of the invention is to provide an MCM, which is very thin in total thickness, and has a high breaking strength when the semiconductor packages are laminated.

More specifically, it is still another object to provide a very thin MCM in which an occurrence of crack in the package due to stress in the bending direction is prevented effectively.

A still another object of the present invention is to provide a manufacturing method for a very thin MCM, having a high breaking strength.

To achieve the above object, a first feature of the present invention inheres in a semiconductor package having: insulating substrates; wiring layers disposed on the surface of the insulating substrate; a semiconductor chip disposed in a device hole provided in the insulating substrate; inner-joint-conductors for connecting at least part of the bonding pads on the surface of the semiconductor chip to the corresponding wiring layers; and connection lands connected to the wiring layers. The device hole is provided so as to penetrate the central portion of the insulating substrate. The thickness of the semiconductor chip is smaller than that of the insulating substrate. Then, the semiconductor chip is disposed in the device hole such that a bottom thereof is flush with a bottom plane of the insulating substrate.

According to the first feature of the present invention, the thickness of the semiconductor chip is reduced smaller than the normally used thickness. As the semiconductor chip, an element semiconductor such as silicon (Si), germanium (Ge), etc. or a compound semiconductor chip such as gallium arsenide (GaAs), gallium phosphide (GaP), indium phosphide (InP), silicon carbide (SiC), etc. may be employed. And according to the semiconductor package of the first feature, a very thin semiconductor package is achieved.

A second feature of the present invention lies in laminated structure assembled by plural pieces of the semiconductor packages, each of the semiconductor packages is already stated in the first feature of the present invention. That is, according to the second feature of the present invention, first and second semiconductor packages, each having the above-described first feature of the present invention, are laminated, for example. The first semiconductor package has: a first insulating substrate; first wiring layers disposed on the first insulating substrate; a first semiconductor chip disposed in a first device hole of the first insulating substrate; first inner-joint-conductors for connecting the first bonding pads to the first internal wiring layers; first connection lands connected to the first wiring layers. On the other hand, the second semiconductor package has a second insulating substrate disposed above the first insulating substrate; second wiring layers disposed on the second insulating substrate; a second semiconductor chip disposed in the second device hole of the second insulating substrate; second inner-joint-conductors for connecting the second semiconductor chip to the second wiring layers; and second connection lands electrically connected to the first connection lands.

Here, the first device hole is formed so as to penetrate the central portion of the first insulating substrate. Likewise, the second device hole is formed so as to penetrate the central portion of the second insulating substrate. The thickness of the first and second semiconductor chip is smaller than that of the first and second insulating substrates. The first semiconductor chip is disposed in the first device hole such that a bottom thereof is flush with a bottom plane of the first insulating substrate. The second semiconductor chip is disposed in the second device hole such that a bottom thereof is flush with a bottom plane of the second insulating substrate. The first inner-joint-conductors connect at least part of the first bonding pads on the first semiconductor chip to the corresponding first wiring layers. The second inner-joint-conductors connect at least part of the second bonding pads on the second semiconductor chip to the corresponding first wiring layers.

According to the MCM of the second feature of the invention, plural pieces of the thin semiconductor packages are laminated on the MCM substrate. And the upper and lower semiconductor packages in a vertical direction are connected through their predetermined connection lands. Therefore, the thin semiconductor packages can be stacked in multi-levels in a preferable fashion, thereby the stacked performance being remarkably improved. If the present invention is applied to, for example, a media card of a digital camera, the media card having a large memory capacity despite a small size can be achieved. Further, because the semiconductor packages are laminated with the top and bottom surfaces of the thin silicon chips inverted and the predetermined connection lands are electrically connected, they can be stacked such that weak portions of the thin semiconductor packages are not aligned on the same projection plane. As a result, the breaking strength of the MCM when the semiconductor packages are laminated is increased and the portion of the package weak to stress in the bending direction can be reinforced, so that an occurrence of crack in the package can be prevented.

Further, because the wiring layer corresponding to an electrode designed not to be electrically connected may be cut off in the package level, just before a lamination process, it is possible to assign each of chips in stacked semiconductor packages with a specific address and determine wiring layout for selection of the specific address. As a result, the respective stacked thin silicon chips can be operated independently of each other.

According to a third feature of the present invention, the first and second semiconductor packages are laminated like the MCM of the second feature. Here, the first semiconductor package has: a first insulating substrate; first wiring layers disposed on the first insulating substrate; a first semiconductor chip disposed above a main surface of the first insulating substrate; first inner-joint-conductors for electrically connecting at least part of the first bonding pads to the corresponding first wiring layers; and a first sealing member filled between the first insulating substrate and the first semiconductor chip. On the other hand, the second semiconductor package has a second insulating substrate shifted by a predetermined distance along a plane parallel to the first insulating substrate relative thereto, having second wiring layers electrically connected to the first wiring layers; a second semiconductor chip disposed above the main surface of the second insulating substrate; second inner-joint-conductors for electrically connecting at least part of the second bonding pads to corresponding one of the second wiring layers; and a second sealing member filled between the second insulating substrate and the second semiconductor chip.

According to the MCM of the third feature of the present invention, plural pieces of the thin semiconductor packages are laminated on the MCM substrate, and conductors connect the upper and lower semiconductor packages through their predetermined electrodes. Therefore, the thin semiconductor packages can be stacked in multi-levels in a preferable fashion, thereby the stacked performance being remarkably improved. Further, because the respective semiconductor packages are placed so that they move horizontally with respect to the plane of a lower semiconductor package and the predetermined electrodes are electrically connected, the mechanical strength is made uniform so that an occurrence of crack in the package becomes hard to occur. Further, it is not necessary to prepare two kinds of the mirror symmetrical packages, and therefore the number of the kinds of necessary packages can be reduced.

A fourth feature of the present invention lies in a method for manufacturing a multi-chip module having the steps of:

(a) thinning a first semiconductor chip having first bonding pads and a second semiconductor chip having second bonding pads to 10 μm–150 μm in thickness, respectively; (b) delineating package wirings on a main surface of a MCM substrate; (c) preparing a first insulating substrate having a first device hole and a second insulating substrate having a second device hole; (d) delineating first wiring layers and first connection lands connected to the first wiring layers on the first insulating substrate; (e) delineating second wiring layers and second connection lands connected to the second wiring layers on the second insulating substrate; (f) placing the first and second insulating substrates on a table so as to mount the first and second semiconductor chips in the first and second device holes; (g) connecting the first bonding pads to the corresponding first wiring layers through first inner-joint-conductors; (h) connecting the second bonding pads to the corresponding second wiring layers through second inner-joint-conductors; (i) sealing the first semiconductor chip and the first inner-joint-conductor with resin and sealing the second semiconductor chip and the second inner-joint-conductor with resin; (j) mounting the first insulating substrate on the MCM substrate so as to electrically connect the package wirings to the first connection lands; and (k) mounting the second insulating substrate on the first insulating substrate so as to electrically connect the first connection lands to the second connection lands.

A fifth feature of the present invention lies in a method for manufacturing a multi-chip module having the steps of: (a) thinning a first semiconductor chip having first bonding pads and a second semiconductor chip having second bonding pads to 10 μm–150 μm in thickness, respectively; (b) delineating package wirings on a main surface of a MCM substrate; (c) preparing a first insulating substrate and a second insulating substrate; (d) delineating first wiring layers on the first insulating substrate; (e) delineating second wiring layers on the second insulating; (f) depositing selectively a sealing member in a first chip mount region on a main surface of the first insulating substrate, mounting the first semiconductor chip at the position of the sealing member and connecting the first bonding pads to the corresponding first wiring layers through first inner-joint-conductors; (g) depositing selectively a sealing member in a second chip mount region on a main surface of the second insulating substrate, mounting the second semiconductor chip at the position of the sealing member and connecting the second bonding pads to the corresponding second wiring layers through second inner-joint-conductors; (h) mounting the first insulating substrate on the MCM substrate and connecting electrically the package wirings to the first wiring layers; and (i) mounting the second insulating substrate on the first insulating substrate by shifting it by a predetermined distance along a plane parallel to the first insulating substrate relative thereto and connecting electrically the first wiring layers to the second wiring layers.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF DRAWINGS

FIG. 7A is the cross sectional view taken along the line VI—VI of FIG. 7B;

DETAILED DESCRIPTION OF THE PREFERRED EMBODIMENTS

Figure 1:
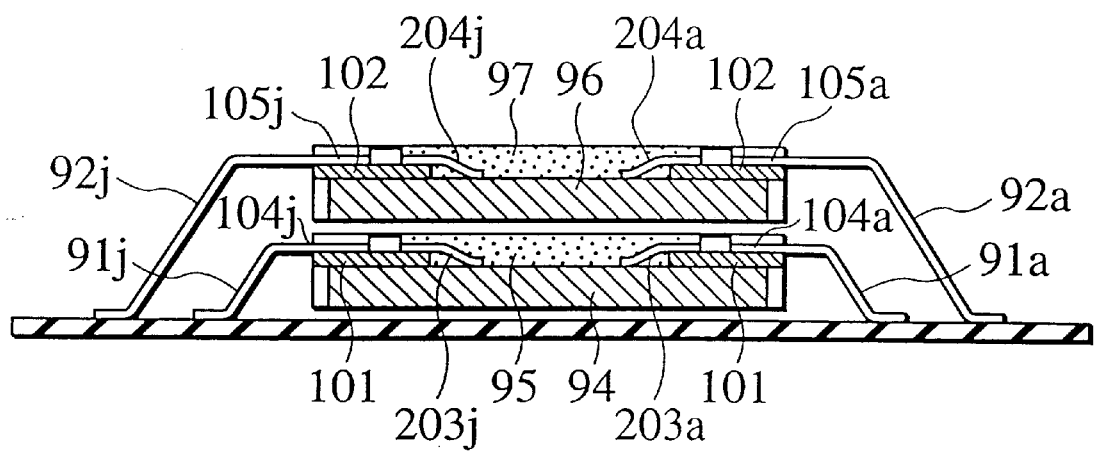
FIG. 1 is a cross sectional view of a conventional MCM in which two semiconductor packages are laminated.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings. In the following descriptions, numerous specific details are set fourth to provide a through understanding of the present invention. However, it will be obvious to those skilled in the art that the present invention may be practiced without such specific details.

Comparative Example

Figure 2:
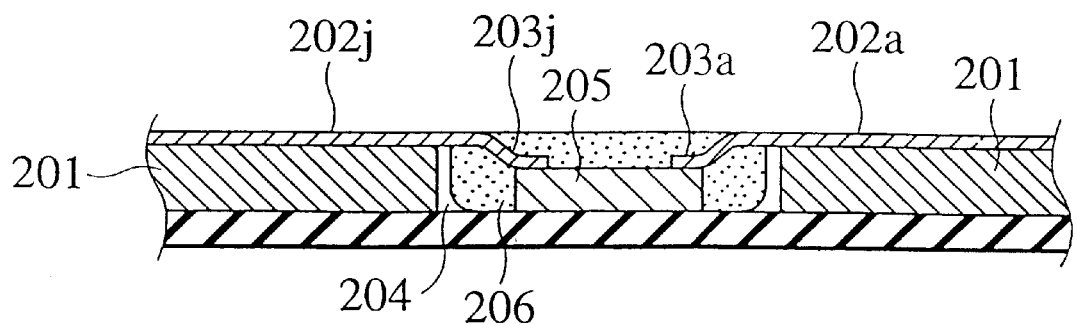
FIG. 2 is a schematic cross sectional view of a semiconductor package as a comparative example.

To reduce the thickness of the semiconductor package further, the inventor of the present invention has used a thin silicon chip 205 thinner than an insulating substrate 201 as shown in FIG. 2. And the inventor has considered, evaluated and assessed a semiconductor package in which this thin silicon chip 205 is completely buried in a device hole 204 of the insulating substrate 201 as shown in FIG. 2. The semiconductor package shown in FIG. 2 has used polyimide film as the insulating substrate 201, and Cu wiring layers 202a, 202j were disposed on the top side thereof. Ends of the Cu wiring layers 202a, 202j served as inner leads 203a, 203j. The inner leads 203a, 203j were connected to bonding pads of the thin silicon chip 205. This thin silicon chip 205 was as thin as, for example, 30 $\mu$m–120 $\mu$m. The thin silicon chip 205 and the inner leads 203a, 203j were sealed and buried in the device hole 204 by resin 206 such as epoxy.

If a semiconductor package was assembled with the thin silicon chip 205 shown in FIG. 2, the entire thickness of the package can be reduced to less than 200 $\mu$m. However, although the entire thickness of the package was able to reduced towards less than 200 $\mu$m by using the structure of the semiconductor package shown in FIG. 2, the mechanical strength of the package itself was found to be very weak. If stress was applied in a bending direction when the MCM was assembled with the overlaying structure shown in FIG. 1, there was found a problem that a crack has occurred in the MCM.

(First Embodiment)

Figure 3A:
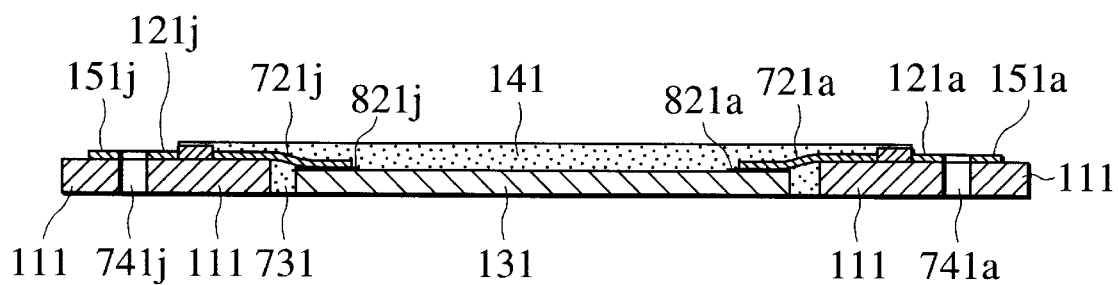
FIG. 3A is a cross sectional view of a semiconductor package according to a first embodiment of the present invention.

As shown in FIG. 3A, the semiconductor package according to the first embodiment of the present invention has an insulating substrate 111, wiring layers 121a, . . . , 121j, . . . disposed on the surface of this insulating substrate 111, a semiconductor chip 131 disposed in the device hole 731 provided in the insulating substrate 111. A plurality of bonding pads 821a, . . . , 821j, . . . are disposed on the surface of the semiconductor chip 131. The semiconductor package according to the first embodiment further has inner-oint-conductors (inner leads) 721a, . . . , 721j, . . . for connecting the bonding pads 821a, . . . , 821j, . . . to the corresponding wiring layers 121a, . . . , 121j, . . . . And connection lands 151a, . . . , 151j, . . . are connected to the wiring layers 121a, . . . , 121j, . . . . The device holes 731 are provided so as to penetrate a central portion of the insulating substrate 111. The semiconductor chip 131 is made thinner than the insulating substrate 111. The semiconductor chip 131 is disposed in the device hole 731 such that its bottom surface is exposed so that the bottom level is flush with the bottom plane of the insulating substrate 111. The insulating substrate 111 is an insulating polymer film having a thickness of, for example, 75 $\mu$m. As the insulating polymer film, for example, polyimide film such as tape automated bonding (TAB) tape is preferable. The insulating substrate (insulating polymer film) 111 acts as "an interposer" of the MCM shown in FIG. 3B.

The wiring layers 121a, . . . , 121j, . . . , each having a thickness of, for example, 18 $\mu$m are bonded to a surface of the insulating substrate (insulating polymer film) 111 with adhesive. The ends of the Cu wiring layers 121a, . . . , 121j, . . . are projected into the device hole 731 forming a group of the inner leads 721a, . . . , 721j, . . . . Although details are not shown, the end portions of the inner leads 721a, . . . , 721j, . . . are electro- or electroless plated with Au (gold) or the like to facilitate connection thereof with the bonding pads 821a, . . . , 821j, . . . . The Cu wiring layers 121a, . . . , 121j, . . . may be entirely plated with Au (gold) or the like.

Each side of the rectangular silicon chip 131 is smaller than sides of rectangular window serving as the device hole 731. The thickness of the silicon chip 131 is elected to be, for example, 50 μm. This silicon chip 131 is buried in the device hole 731 in a face up orientation. The respective bonding pads 821a, ..., 821j, ... provided on perimeter of the surface of the silicon chip 131 are bonded to the inner leads 721a, ..., 721j, ... through a thermocompression process called "gang bonding". This process is referred as "inner lead bonding (ILB)". The inner leads 721a, ..., 721j, ... can be bonded to bonding pads 821a, ..., 821j, ... using soldering, by heating with pressure. As the interposer 111, another flexible substrate different from the TAB tape can be employed. Further, instead of the flexible substrate a rigid substrate, or a polymer substrate reinforced with woven fibers (e-glass, s-glass, quartz, aramid etc.) may be used as the interposer 111. As the rigid substrate, a very common laminate material, consisting of epoxy and e-glass may be used. This glass epoxy is referred as "American National Standard Institute (ANSI) FR-4 grade substrate".

Further, a beam lead having bump may be used to connect the interposer 111 to the silicon chip 131. Further, wire bonding method can be used to connect the interposer 111 to the silicon chip 131.

A sealed resin layer 141 is formed so as to cover a area in which the silicon chip 131 is buried in the device hole 731 and an adjacent area in which the connecting portions between the bonding pads 821a, ..., 821j, ... and inner leads 721a, ..., 721j, ... are included. This sealed resin layer 141 is buried in a gap between the sidewall of the device hole 731 and the semiconductor chip 131. The sealed resin layer 141 is buried so as to have the same bottom level as the bottom plane of the insulating substrate 111 as shown in FIG. 3A. The connection lands 151a, ..., 151j, ... are connected to the Cu wiring layers 121a, ..., 121j, .... Through holes 741a, ..., 741j, ... are respectively formed just below the connection lands 151a, ..., 151j, ... within the insulating substrate 111. The thickness of the thin semiconductor pakage according to the first embodiment of the present invention as shown in FIG. 3A can be reduced to, for example, less than 200 μm.

Figure 3B:
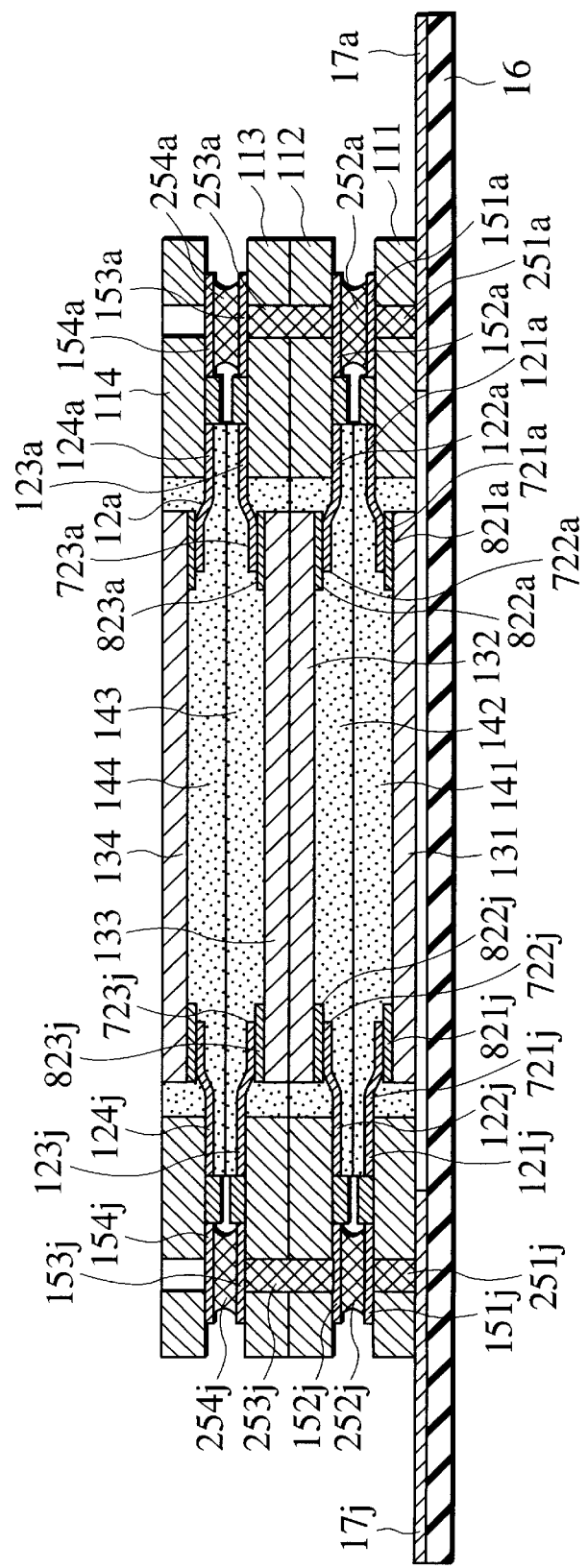
FIG. 3B is a cross sectional view of the MCM according to the first embodiment of the present invention, assembled by laminating four semiconductor packages, each of which is shown in FIG. 3A.

Then, as shown in FIG. 3B, it is permissible to assemble the MCM by laminating four pieces of the semiconductor packages, each of which described in FIG. 3A. Namely, in FIG. 3B, the same first to fourth semiconductor packages as that shown in FIG. 3A is laminated on a MCM substrate 16 one by one. The thickness of each of the first to fourth semiconductor chips 131–134 mounted in the first to fourth semiconductor packages is smaller than that of each of the first to fourth insulating substrates 111–114, respectively. Package wirings 17a, ..., 17j, ... are delineated on the surface of the MCM substrates 16.

The first semiconductor package has a first insulating substrate 111, first wiring layers 121a, ..., 121j, ... disposed on the surface of the first insulating substrate 111, a first semiconductor chip 131 disposed in the first device hole of the first insulating substrate 111, first inner-joint-conductors (inner leads) 721a, ..., 721j, ... for connecting at least part of the first bonding pads 821a, ..., 821j, ... on the surface of the first semiconductor chip 131 to at least part of the corresponding first wiring layers 121a, ..., 121j, .... First connection lands 151a, ..., 151j, ... are connected to the first wiring layers 121a, ..., 121j, .... The first device hole is formed so as to penetrate the central portion of the first insulating substrate 111. The first semi-conductor chip 131 is disposed in the first device hole such that its bottom surface is exposed so as to be flush with the bottom plane of the first insulating substrate 111. First through holes are formed just below the first connection lands 151a, ..., 151j, ... within the first insulating substrate 111. First stud conductors 251a, ..., 251j, ... are buried in the first through holes so as to be connected to the package wirings 17a, ..., 17j, ... on the surface of the MCM substrate 16. A first sealing resin 141 is buried in a gap between the sidewall of the first device hole and the first semiconductor chip 131. The bottom surface of the first sealing resin 141 is configured such that it flushes with the bottom plane of the first insulating substrate 111.

On the other hand, the second semiconductor package has a second insulating substrate 112 disposed above the first insulating substrate 111, second wiring layers 122a, ..., 122j, ... disposed on the surface of the second insulating substrate 112, second semiconductor chip 132 disposed in the second device hole of the second insulating substrate 112, second inner-joint-conductors (inner leads) 722a, ..., 722j, ... for connecting at least part of the second bonding pads 822a, 822j on the surface of the second semiconductor chip 132 to at least part of the corresponding second wiring layers 122a, ..., 122j, ... and second connection lands 152a, ..., 152j, ... connected to the second wiring layers 122a, ..., 122j, ... and electrically connected to the first connection lands 151a, ..., 151j, .... The first connection lands 151a, ..., 151j, ... and the second connection lands 152a, ..., 152j, ... are connected to each other through land joint conductors 252a, ..., 252j, .... As the land joint conductors 252a, ..., 252j, ..., solder or other conductive adhesive may be used. The second device hole is formed so as to penetrate the central portion of the second insulating substrate 112. The second semiconductor chip 132 is disposed in the second device hole such that its bottom is flush with the bottom plane of the second insulating substrate 112. The second through hole is formed in the second insulating substrate just above each of the second connection lands 152a, ..., 152j, ..... The second sealed resin 142 is buried in a gap between the sidewall of the second device hole and the second semiconductor chip 132. The bottom of the second sealed resin 142 is exposed so that it is flush with the bottom plane of the second insulating substrate 112. Second stud conductors 253a, ..., 253j, ... are buried in the second through holes.

The third semiconductor package has a third insulating substrate 113, third wiring layers 123a, ..., 123j, ... disposed on the surface of the third insulating substrate 113, third semiconductor chip 133 disposed in the third device hole of the third insulating substrate 113, third inner-joint-conductors (inner leads) 723a, ..., 723j, ... for connecting at least part of the third bonding pads 823a, ..., 823j, ... on the surface of the third semiconductor chip 133 to at least part of the corresponding third wiring layers 123a, ..., 123j, .... And third connection lands are connected to the third wiring layers 123a, ..., 123j, .... Further, the third semiconductor package has third through holes formed just below the third connection lands 153a, ..., 153j, ... in the third insulating substrate 113. The second stud conductors 253a, ..., 253j, ... extends from a side of the second semiconductor package so as to be buried in each of the third through holes. The third device hole is formed so as to penetrate the central portion of the third insulating substrate 113. The third semiconductor chip 133 is disposed in the third device hole such that its bottom is exposed. The bottom of the third semiconductor chip 133 is configured such that it is flush with the bottom plane of the third insulating substrate 113.

In the fourth semiconductor package also, the fourth semiconductor chip 134 is disposed in a fourth device hole provided in the fourth insulating substrate 114. The fourth semiconductor chip 134 is disposed such that its bottom is exposed. And it is configured such that the bottom of the fourth semiconductor chip 134 is flush with the bottom plane of the fourth insulating substrate 114.

Figure 4:
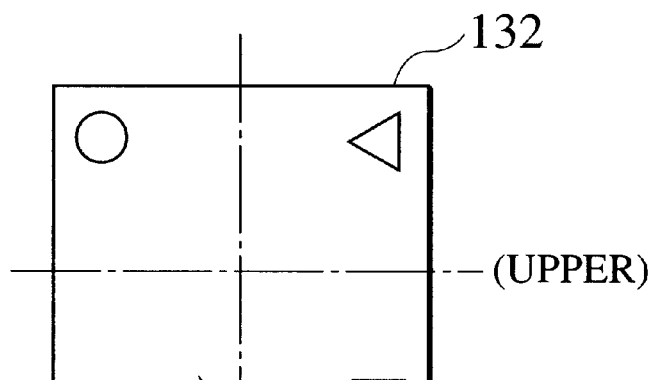
FIG. 4 is a diagram for explaining a symmetrical relation of an upper and a lower semiconductor chips convenient for laminating the semiconductor packages according to the first embodiment of the present invention.
Figure 4:
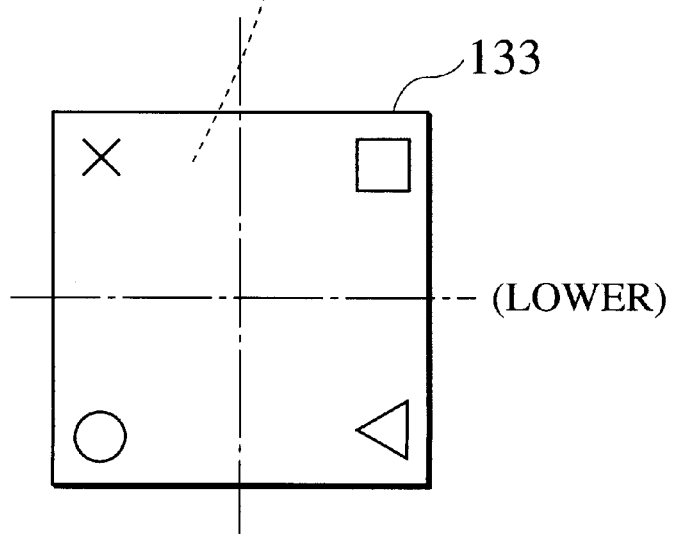

If, as shown in FIG. 3B, the semiconductor packages according to the first embodiment are laminated in a vertical direction relative to the chip surface, they are configured such that back sides of upper and lower pieces in a vertical direction mate with each other. That is, the top and bottom surfaces of each of the packages are inverted. More specifically, the top and bottom surfaces of the adjacent packages, each having the same function, are inverted when they are laminated. Then, as shown in FIG. 4, it is preferable to prepare the upper and lower silicon chips 132, 133 in a mirror symmetry topology as to the layout of the bonding pads.

Figure 5A:
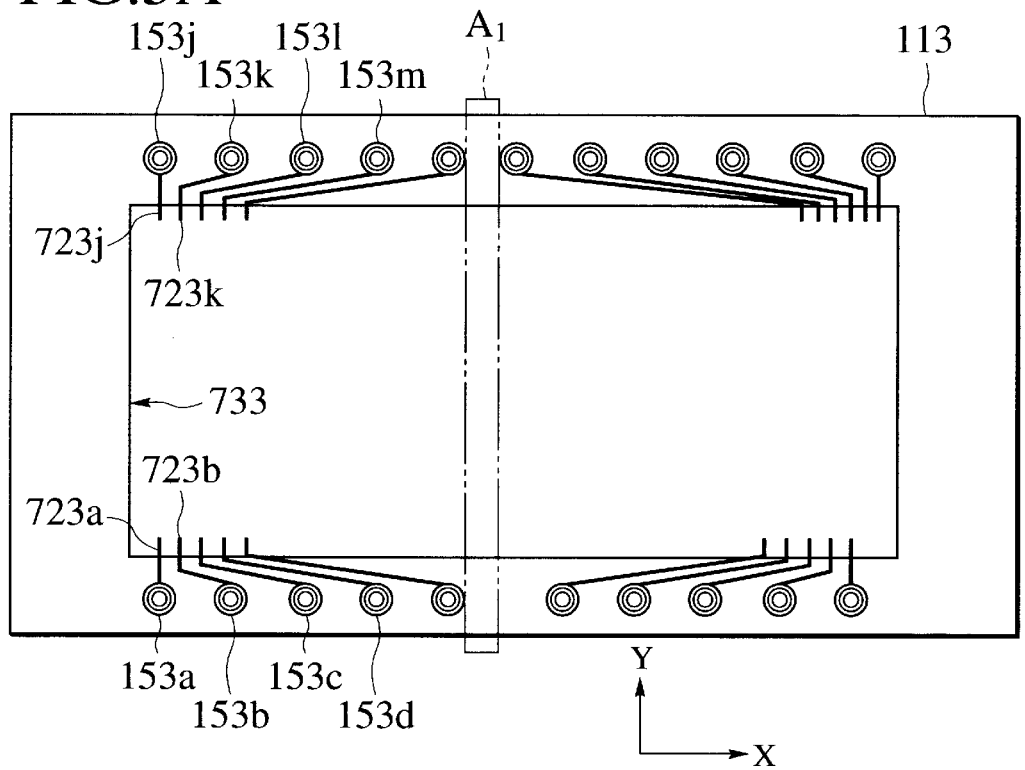
FIGS. 5A and 5B are diagrams for explaining a symmetrical relation of an upper and a lower semiconductor packages convenient for laminating the semiconductor packages according to the first embodiment of the present invention.
Figure 5B:
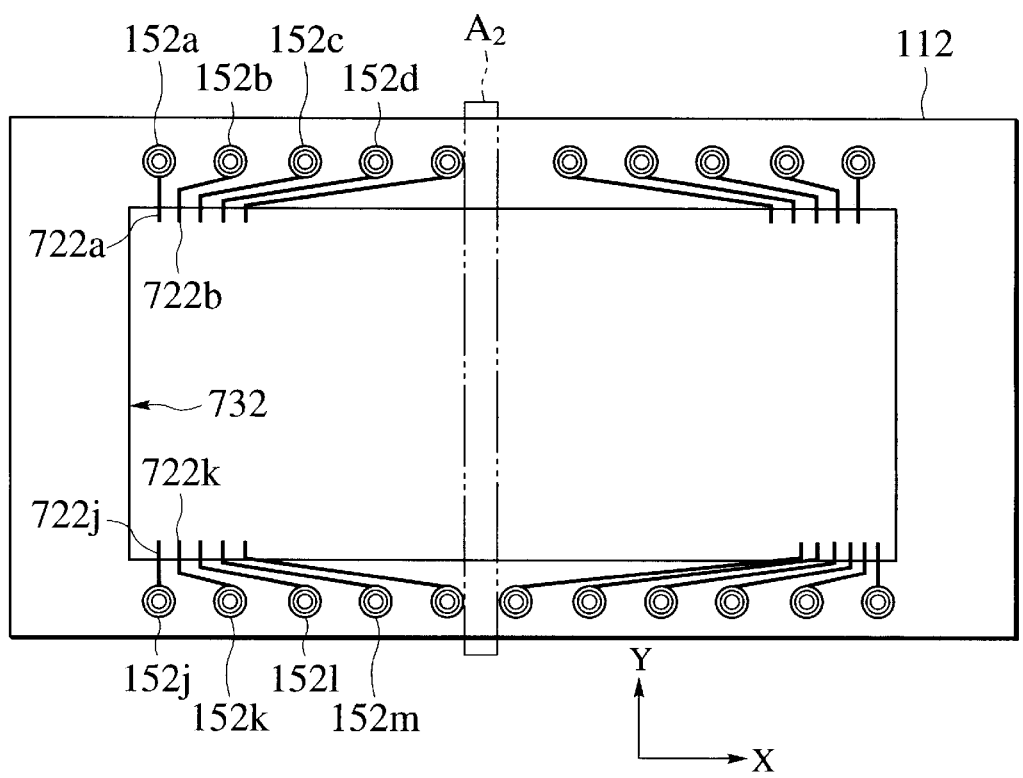

And further, it is preferable to prepare the upper and lower interposers 112, 113 in a mirror symmetrical relation to each other, as shown in FIGS. 5A and 5B. Namely, in this topology the second wiring layers $122a, \ldots, 122j, \ldots$, the second inner leads $721a, 721j$, and the second connection lands $152a, \ldots, 152j, \ldots$ of the interposer 112 are mirror-symmetrical to the third wiring layers $123a, \ldots, 123j, \ldots$, the third inner leads $723a, \ldots, 723j, \ldots$ and the third connection lands $153a, \ldots, 153j, \ldots$, respectively, of the inter poser 113. It is permissible to employ another topology such that any one of the silicon chip and wiring is mirror symmetrical.

As shown in FIG. 3B, the insulating substrates 112, 113 are stacked so that their back sides face each other. Then, the through holes just above the connection lands $152a, \ldots, 152j, \ldots$ of the second level become continuous with the through holes just below the connection lands $153a, \ldots, 153j, \ldots$ of the third level. If a hole is made in the center of each of the respective lands $151a, 152a, 153a, 154a, \ldots, 151j, 152j, 153j, 153j, \ldots$ continuous through holes are produced from the lands $154a, \ldots, 154j, \ldots$ of the fourth level up to the package wirings $17a, \ldots, 17j, \ldots$ running on the surface of the MCM substrate 16. With this condition, the through holes are filled with conductive adhesive and then, the conductive adhesive is left to harden, thereby the connection lands $151a, 152a, 153a, 154a, 151j, 152j, 153j, 15j$ being electrically connected to the package wirings $17a, \ldots, 17j, \ldots$ of the MCM substrate 116. Then, the MCM according to the first embodiment has been achieved.

The first embodiment has the following advantages because the thin semiconductor package is constructed in the above-described stacked structure.

(1) For example, there may be a portion which any wire does not cross on the interposers 113, 112, or the insulating substrate (insulating polymer film), like regions $A_1, A_2$ indicated by two-dots and dash lines in plan views of the interposers 113, 112 shown in FIGS. 5A, 5B. If there is a portion such as the regions $A_1, A_2$, there is a possibility that the portion becomes weak to bending or twisting stress. Further, at a portion having a concentrated fuse area on the silicon chip, mechanical strength of the chip may drop at the concentrated fuse area. This is because the fuse-blow removes a passivation film at the concentrated fuse area, and the mechanical strength of the package may locally become lower at the blowed portion. Generally in viewpoint of the mechanical strength of materials, in case where the thickness of a rectangular slab is reduced equivalent times, the bending strength is inversely proportional to square of the thickness, based upon a simplified calculation. Therefore, if the thickness of the package is 200 $\mu$m as compared to the conventional package having the thickness of 500 $\mu$m, the breaking strength thereof is $(2/5)^2=1/6.25$. According to the first embodiment, if the packages are laminated by shifting slightly along the X direction, i.e., along the length direction thereof in FIGS. 5A, 5B, the portions near the regions $A_1, A_2$ indicated by the two-dots and dash line are moved so that the weak portion is dissipated. That is, if the top and bottom surfaces are inverted and the packages are shifted in parallel slightly in the length direction thereof, the packages can be stacked without overlaying the weak portions of the thin semiconductor package on the same plane. As a result, the breaking strength when the packages are laminated is averaged so that the portion weak to bending or twisting may be reinforced.

(2) In the MCM according to the first embodiment, each of thin silicon chips 131, 132, 133, 134, each having a thickness of about 50 $\mu$m, can be mounted so as to form a thin semiconductor package of less than 200 $\mu$m. And the four semiconductor packages can be laminated so that entire thickness of a thin MCM becomes to be less than 800 $\mu$m. That is, it is possible to provide a remarkably thin, practically high density MCM. For example, if this MCM is applied to a media card of a digital camera, the media card having a large memory capacity can be realized despite a small size and a thin structure. If the thickness of the thin silicon chip 131 is reduced to about 30 $\mu$m, the thickness of a single thin semiconductor package can be reduced to less than 120 $\mu$m, so that the entire thickness of the MCM in which four pieces of the packages are laminated is 480 $\mu$m. If the thickness of the semiconductor package is set to less than four times of the thickness of the thin silicon chip as described above, it is very convenient for assembling a thin MCM having desired performance. Generally, the thickness of the thin silicon chip 131 may be selected in a range from 30 $\mu$m to 120 $\mu$m.

(3) Because the semiconductor package according to the first embodiment uses the thinner silicon chips 131, 132, 133, 134 than the interposers 111, 112, 113, 114, a trouble associated with a leakage current, which may occur when the inner leads $721a, \ldots, 721j, \ldots; 722a, 722j; 723a, \ldots, 723j, \ldots; \ldots$ come into contact with the chip edge, can be prevented.

Next, a manufacturing method for the thin semiconductor package according to the first embodiment will be described.

Figure 6A:
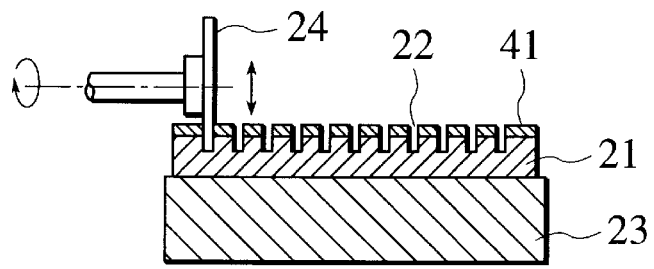
FIGS. 6A to 6G are cross sectional process diagrams showing a manufacturing method for the thin semiconductor package of the first embodiment.

(a) First, a predetermined pattern of a semiconductor integrated circuit is defined on the surface of a silicon wafer 21 through a sequence of predetermined photolithography process, chemical vapor deposition (CVD) process, oxidation process, ion implantation process, etching process and the like. Then, passivation films such as phosphosilicate glass (PSG) film, boro-phosphosilicate glass (BPSG) film, silicon nitride film ($Si_3N_4$ film) are deposited on the surface of the silicon wafer 21. That is, a pattern 41 of the semiconductor integrated circuit is delineated periodically on the surface of the silicon wafer 21 according to step-and-repeat method by stepper machine, so as to define chip areas. There are dice cutting lanes in a matrix form between the periodically arranged chip areas. Then, as shown in FIG. 6A, the silicon wafer 21 in which the LSI patterns are periodically delineated is fixed on a worktable 23 of a dicing machine, with a orientation such that the LSI pattern formed surface is facing upward, according to a predetermined method. For example, the silicon wafer 21 is sucked with a vacuum chuck and fixed. Then, the dicing blade 24 is rotated, and grooves 22 deeper than the thickness of the completed chip (for example 50 μm) are dug. The grooves 22 are formed in a matrix form, along the dicing lanes, by employing the dicing blade 24.

Figure 6B:
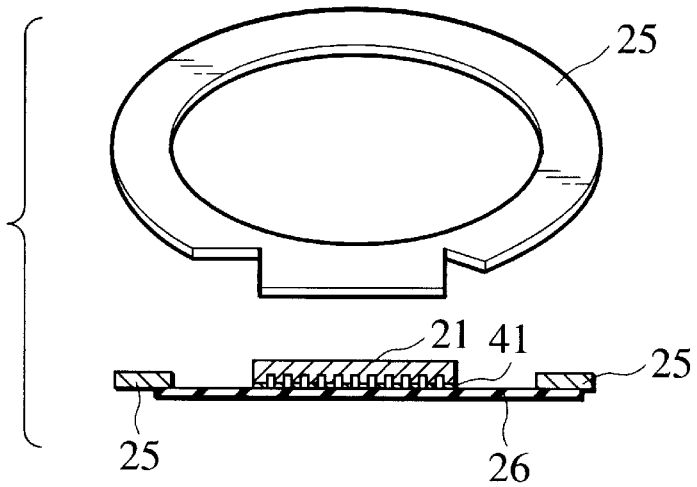

(b) Next, as shown in FIG. 6B, a flat ring 25 is bonded to a surface protecting tape 26. Wrinkles on the surface protecting tape 26 are removed with the flat ring 25. Then, the LSI pattern formed surface 41 of the silicon wafer 21 in which the grooves 22 are dug is bonded and fixed to an adhesive side of the surface protecting tape 26.

Figure 6C:
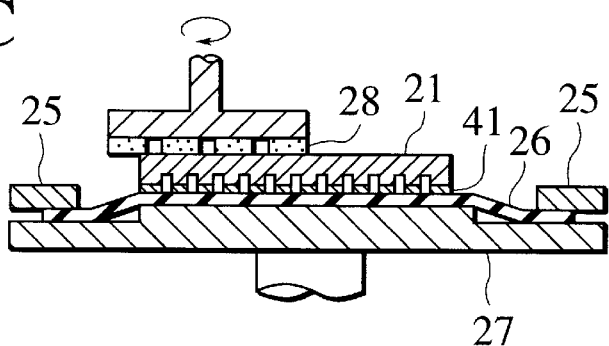

(c) Then, a bottom face of the silicon wafer 21 is ground according to, for example, "infield grinding method". That is, as shown in FIG. 6C, the silicon wafer 21 held by the flat ring 25 and surface protecting tape 26 is sucked by and fixed to the work table 27 of the grinding unit. The bottom face of the silicon wafer 21 is ground with a grinding stone pressed thereto. At this time, the back face (grinding face) of the silicon wafer 21 is ground by rotating the grinding stone 28 and work table 27 until the back face reaches the bottoms of the grooves 22. If the grinding face reaches the bottoms of the grooves 22, the silicon wafer 21 is automatically divided into individual silicon chips. The depth of this grinding is determined by the consideration of the thickness of the completed silicon chips 131, 132, 133, 134, . . . (for example, 50 μm).

Figure 6D:
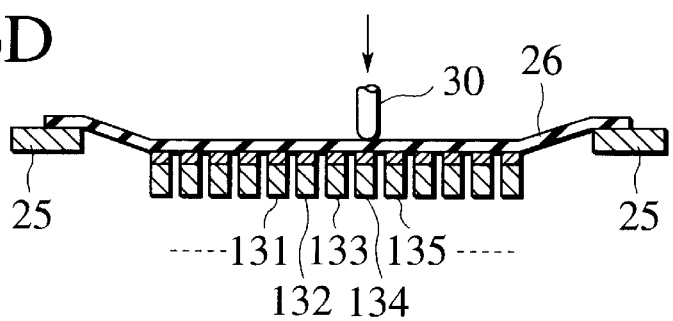

(d) Then, as shown in FIG. 6D, the flat ring 25 to which the divided individual silicon chips 131, 132, 133, 134, . . . are bonded and fixed is installed on a die bonding unit. Then, a downward pressure is applied to the pattern forming face 41 through the surface protecting tape 26 using a tool 30 such as a pick-up needle. Consequently, the silicon chips 131, 132, 133, 134, . . . are separated from the surface protecting tape 26. In this manner, the silicon chips 131, 132, 133, 134, . . . each having a thickness of for example 50 μm are completed.

Figure 6E:
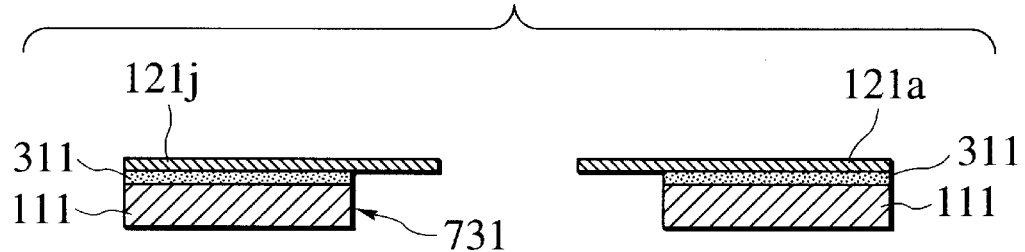

(e) Next, an insulating polymer film (for example, polyimide film) tape, which is 75 μm thick, having periodically arranged device holes 731, 731, 731, . . . in the center thereof is prepared. Copper (Cu) foil 18 μm thick is laminated entirely on the surface of the insulating substrate (insulating polymer film) 111 in the form of tape. Then a interposer 111 in which Cu wiring layers 121a, . . . , 121j, . . . are formed as shown in FIG. 6E by selective etching with photolithography or the like, are prepared. Although not shown, each of the first connection lands 151a, . . . , 151j, . . . merges the corresponding Cu wiring layers 121a, . . . , 121j, . . . so as to form an integral Cu wiring pattern. End portions of the Cu wiring layers 121a, . . . , 121j, . . . constituting the inner leads 721a, . . . , 721j, . . . are protruded from both sides into inside of the device holes 731, 731, 731, . . . periodically arranged on the interposer 111. Then, the end portions of the inner leads 721a, . . . , 721j, . . . are plated with Au films to facilitate connection thereof to the bonding pads 821a, . . . , 821j, . . . . Meanwhile, it is assumed that the thickness of the insulating substrate (insulating polymer film) 111 is for example, 75 μm and that the thickness of the Cu wiring layers 121a, . . . , 121j, . . . is 18 μm.

Figure 6F:
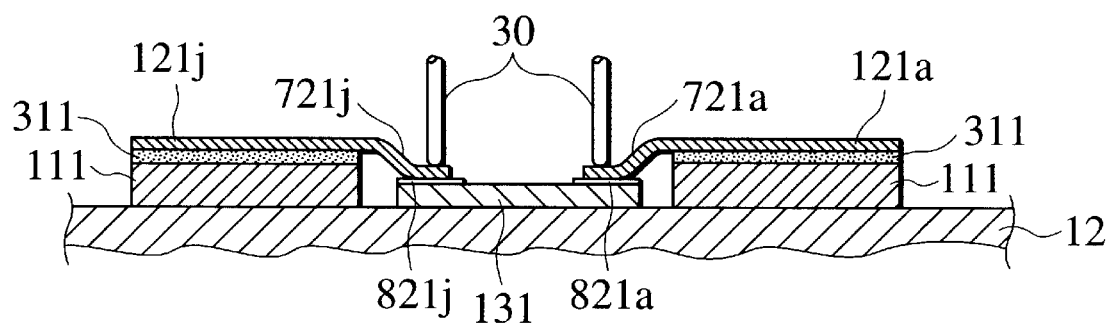

(f) Then, as shown in FIG. 6F, the interposer 111 is placed on the table 12 and the thin silicon chips 131, 131, 131, . . . are placed within the respective device holes 731, 731, 731, . . . in a face up orientation. As a result, each of the bottom face of the silicon chips 131, 131, 131, . . . coincides with the bottom plane of the interposer 111. Then, bonding pads 821a, . . . , 821j, . . . of each of the silicon chip 131, 131, 131, . . . are bonded to the corresponding inner leads 721a, . . . , 721j, . . . with a bonding tool 30 according to single-point bonding method.

Figure 6G:
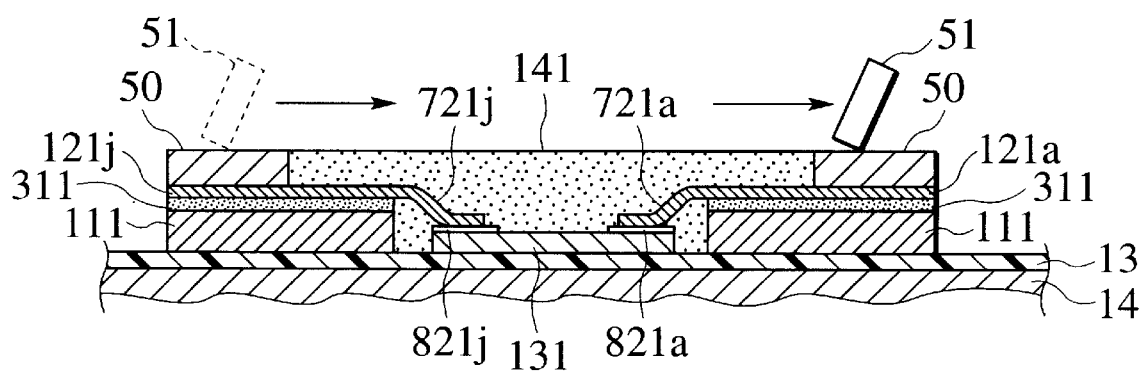

(g) In a subsequent process, the surfaces of the silicon chips 131, 131, 131, . . . placed within the device holes 731 and peripheral portions of bonding portions between the bonding pads 821a, . . . , 821j, . . . and the inner leads 721a, . . . , 721j, . . . are sealed with resins. For this purpose, sealing resins 141, 141, 141, . . . are coated according to screen printing method. More specifically, as shown in FIG. 6G, adhesive tape 13 is spread over another table 14, and the interposer 111 having the silicon chips 131, 131, 131, . . . , bonded in the process shown in FIG. 6F, is placed thereon. Then, a metal mask (stencil screen) 50 having a window pattern of a shape corresponding to the above described resin sealing portion is set up on the interposer 111. With this condition, after the liquid sealing resins 141, 141, 141, . . . are applied from above, and a squeegee 51 is moved over an entire surface of the metal mask 50 so as to fill with the sealing resins 141, 141, 141, . . . through the metal mask 50. As a result, the sealing resins 141, 141, 141, . . . are transferred to the periodically arranged locations of the interposer 111 through the metal mask 50.

(h) Next, heat treatment (curing) is carried out to harden the liquid sealing resins 141, 141, 141, . . . . As the curing condition at this time, the heat treatment is carried out for an hour in an ambient of, for example, 100° C. and after that, for two hours in the ambient of 160° C. As a result, the liquid sealing resins 141, 141, 141, . . . are hardened so that the silicon chips 131, 131, 131, . . . each having a thickness of, for example, 50 μm are disposed periodically such that they face upward and buried in the device holes 731, 731, 731, . . . .

(i) At this stage, the packages are formed continuously on the interposer 111, which is a continuous tape. If separating the individual packages by cutting, the thin semiconductor packages having the structure shown in FIG. 3A are completed.

Although the screen printing method is used for resin sealing according to the first embodiment, it is permissible to use for example, "potting method", "laminate method" or the like.

One of the purposes for laminating the packages is to increase the memory capacity. In this case, if all pins of the four packages in the MCM shown in FIG. 3B are on the same potential, the thin silicon chips 131, 132, 133, 134 operate in the same way and therefore this is meaningless. Thus, two pins are selected in each of the four packages and the four thin silicon chips 131,132,133, 134 are distinguished depending on a way for supplying an electric power to the selected two pins. Specific address is set up for each of the thin silicon chips 131, 132, 133, 134, depending on whether or not an electric power is supplied to a particular pin. Then, each of the laminated thin silicon chips can operate independently.

To achieve this, wiring layers are formed preliminarily on the specific address-setting pins of each of the interposers 111, 112, 113, 114. As shown in a portion "P" of FIG. 7B, a pin to which no electric power is applied is determined for each of the interposers 111, 112, 113, 114. For example, in the interposer 111, the wiring layer 121k is punched out just before lamination process so as to cut the wiring 1231k. In case where four packages are laminated as shown in FIG. 3B, two wiring layers 121j, 121k; 122j, 122k; 123j, 123k; 124j, 124k for selecting combinations of the applications of the electric power are metallized preliminarily for each of the interposers 111, 112, 113, 114. The combinations of wire cutting off process for the wiring layers 121j, 121k; 122j, 122k; 123j, 123k; 124j, 124k are classified to four modes. That is, if a state where the wiring layer is disconnect is defined to be "0" and a state where the wiring layer is conductive is defined to be "1", four modes of address data, namely, "0, 0", "0, 1", "1, 0", "1, 1" can be assigned for each of the packages.

Further, because the optionally selected particular wiring layers 121j, 121k; 122j, 122k; 123j, 123k; 124j, 124k are punched out so as to break each wiring layer just before lamination process, these packages can be handled as a same kind of the package at the package fabrication stage.

(Second Embodiment)

Figure 8A:
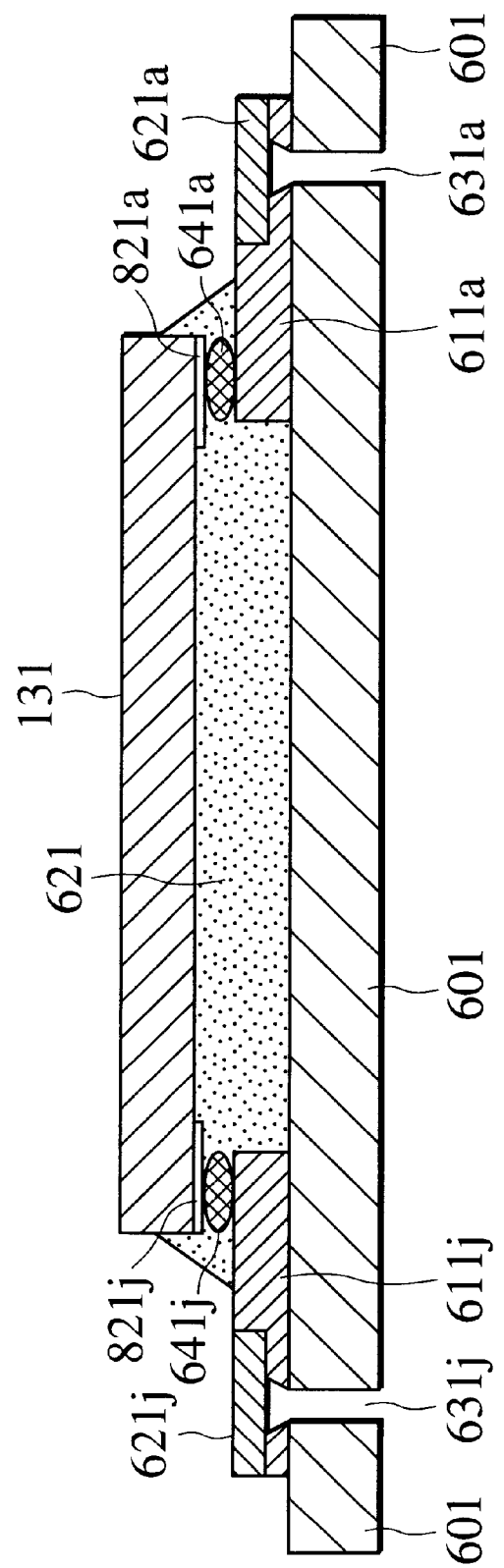
FIG. 8A is a cross sectional view of a discrete semiconductor package according to a second embodiment of the present invention.

As shown in FIG. 8A, the semiconductor package according to the second embodiment of the present invention has an insulating substrate 601, a semiconductor 131 chip disposed above the main surface of the insulating substrate 601, inner-joint-conductors 641a, . . . , 641j, . . . for connecting the semiconductor chip 131 to the insulating substrate 601, and a sealing member 621 filled between the insulating substrate 601 and the semiconductor chip 131. A plurality of wiring layers 611a, . . . , 611j, . . . such as the Cu wiring layers are disposed on the surface of the insulating substrate 601. Preferably, the thickness of the Cu wiring layers 611a, . . . , 611j, . . . is, for example, about 18 $\mu$m. On the other hand, plural bonding pads 821a, . . . , 821j, . . . are disposed on perimeter of the surface of the semiconductor chip 131. The inner-joint-conductors 641a, . . . , 641j, . . . electrically connects at least part of plural bonding pads 821a, . . . , 821j, . . . on the surface of the semiconductor chip 131 to corresponding plural wiring layers 611a, . . . , 611j, . . . . As this inner-joint-conductors 641a, . . . , 641j, . . . , Au (gold) bump or solder ball may be used. The sealing member 621, adapted for electrically and mechanically connecting the semiconductor chip 131 to the insulating substrate 601, is preferable to use anisotropic conductive material. The "anisotropic conductive material" is an insulating polymer film, such as urethane resin, epoxy resin or the like, dispersed with metallic particles so that sufficient metallic particles are present to only allow conduction perpendicular to the plane of the substrate surface. In other word, the polymer film only conducts current in a direction perpendicular to the plane of the MCM substrate surface. Commonly used metallic particles in the ACF include gold (Au), silver (Ag), nickel (Ni), and titanium nickel alloy (Ti—Ni). Because the anisotropic conductive film has anisotropy that only a place applied with stress has conductivity, only portions near the bonding pads 821a, . . . , 821j, . . . have the conductivity. The insulating substrate 601 functions as an interposer for the MCM. As the insulating substrate 601, for example, an insulating polymer film such as polyimide film may be used. More specifically, for example, TAB tape may be used as the insulating substrate 601. The thickness of the insulating polymer film 601 may be, for example, about 75 $\mu$m.

As shown in FIG. 8A, the thin silicon chip 131 having the thickness of about 50 $\mu$m is mounted in the center of the interposer 601. That is, the wiring layers (Cu wirings) of the interposer 601 are connected, via the inner-joint-conductors 641a, . . . , 641j, . . . , to the thin silicon chip 131 in a flip-chip orientation, by the anisotropic conductive film 621. Then, the Cu wiring layers 611a, . . . , 611j, . . . of the interposer 601 are stretching out from the surface of the thin silicon chip 131 so that connection lands 621a, . . . , 621j, . . . are formed.

Figure 8B:
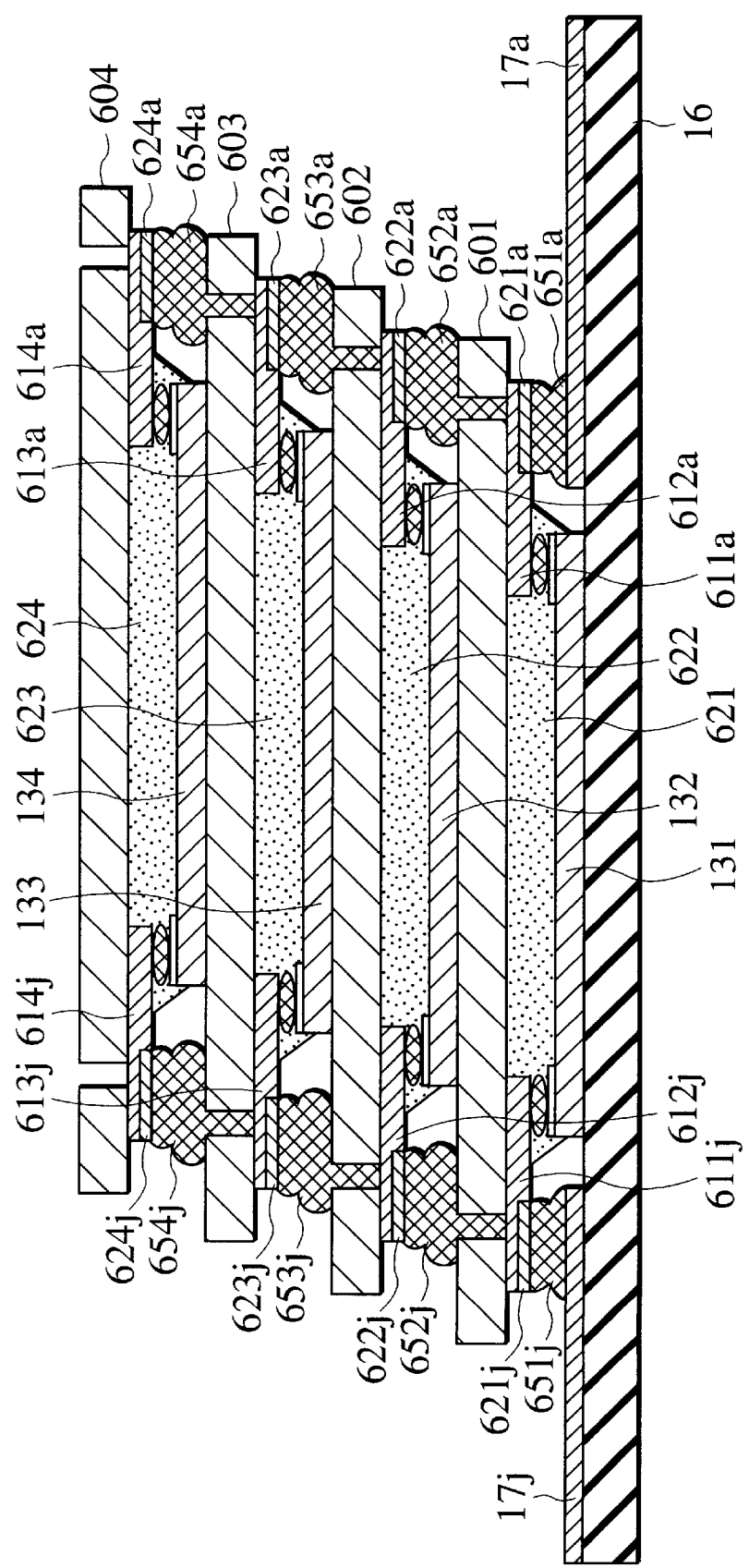
FIG. 8B is a cross sectional view of the MCM according to the second embodiment of the present invention, constructed by laminating the discrete semiconductor packages, each of which is shown in FIG. 8A.

As shown in FIG. 8B, four pieces of the semiconductor packages described with reference to FIG. 8A are laminated so as to assemble the MCM. In FIG. 8B, first to fourth semiconductor packages each of which is the same as that of FIG. 8A are laminated on the MCM substrate 16. The MCM substrate 16 has plural package wirings 17a, . . . , 17j, . . . on its main surface.

The first semiconductor package has a first insulating substrate (first interposer) 601, plural first wiring layers 611a, . . . , 611j, . . . disposed on the surface of the first insulating substrate 601, a first semiconductor chip 131 disposed above the main surface of the first insulating substrate 601, first inner-joint-conductors 641a, . . . , 641j, . . . for electrically connecting at least part of the plural first bonding pads of the first semiconductor chip 131 to the corresponding plural first wiring layers 611a, . . . , 611j, . . . and a first sealing member 621 filled between the first insulating substrate 601 and the first semiconductor chip 131.

On the other hand, the second semiconductor package has a second insulating substrate (second interposer) 602, a second semiconductor chip 132 disposed above the main surface of the second insulating substrate 602, and second inner-joint-conductors for electrically connecting the second semiconductor chip 132 to the second insulating substrate 602. The second insulating substrate 602 is shifted by a predetermined distance along a plane parallel to the surface of the first insulating substrate 601, relative to the first insulating substrate 601. Plural second wiring layers 612a, . . . , 612j, . . . electrically connected to the plural first wiring layers 611a, . . . , 611j, . . . are disposed on the main surface of the second insulating substrate 602. The second inner-joint-conductors connect at least part of the second bonding pads on the surface of the second semiconductor chip 132 to the corresponding plural second wiring layers 611a, . . . , 611j, . . . . The second sealing member 622 is filled between the second insulating substrate 602 and the second semiconductor chip 132.

The third semiconductor package has a third insulating substrate (third interposer) 603, a third semiconductor chip 133 disposed above the main surface of the third insulating substrate 603, third inner-joint-conductors for electrically connecting the third semiconductor chip 133 to the third insulating substrate 603 and a third sealing member 623 filled between the third insulating substrate 603 and the third semiconductor chip 133 and the like. The third insulating substrate 603 is shifted by a predetermined distance along a plane parallel to the surface of the second insulating substrate 602 relative to the second insulating substrate 602.

Further, the fourth semiconductor package has a fourth insulating substrate (fourth interposer) 604, a fourth semiconductor chip 134 disposed above the main surface of the fourth insulating substrate 604, fourth inner-joint-conductors for electrically connecting the fourth semiconductor chip 134 to the fourth insulating substrate 604 and a fourth sealing member 624 filled between the fourth insulating substrate 604 and the fourth semiconductor chip 133 and the like. The fourth insulating substrate 604 is shifted by a predetermined distance along a plane parallel to the surface of the third insulating substrate 603 relative to third insulating substrate 603.

The Cu wiring layers 611a, . . . , 611j, . . . of the first insulating substrate (first interposer) 601 are stretching out from the surface of the thin silicon chip 131 so that the first connection lands 621a, . . . , 621j, . . . are formed. Likewise, the Cu wiring layers 612a, . . . , 612j, . . . of the second insulating substrate (second interposer) 602 are stretching out from the surface of the thin silicon chip 132 so that the second connection lands 622a, . . . , 622j, . . . are formed. Further, the Cu wiring layers 613a, . . . , 613j, . . . of the third insulating substrate (third interposer) 603 are stretching out from the surface of the thin silicon chip 133 so that the third connection lands 623a, . . . , 623j, . . . are formed. Further, the Cu wiring layers 614a, . . . , 614j, . . . of the fourth insulating substrate (fourth interposer) 604 are stretching out from the surface of the thin silicon chip 134 so that the fourth connection lands 624a, . . . , 624j, . . . are formed. The first connection lands 621a, . . . , 621j, . . . are connected to the package wirings 17a, . . . , 17j, . . . through first outer-joint-conductors 651a, . . . , 651j, . . . such as solder ball. The second connection lands 622a, . . . , 622j, . . . are connected to the first connection lands 621a, . . . , 621j, . . . through the second outer-joint-conductors 652a, . . . , 652j. . . . The third connection lands 623a, . . . , 623j, . . . are connected to the second connection lands 622a, . . . , 622j, . . . through the third outer-joint-conductors 653a, . . . , 653j. . . . The fourth connection lands 624a, . . . , 624j, . . . are connected to the third connection lands 623a, . . . , 623j, . . . through the fourth outer-joint-conductors 654a, . . . , 654j . . . .

In the stacked configuration according to the second embodiment of the present invention, as shown in FIG. 8B, upper and lower packages are shifted relative to each other to reinforce portions weak in mechanical strength. Therefore, upper and lower pins having the same potential are connected to each other through the outer-joint-conductors such that they are shifted horizontally.

The MCM according to the second embodiment of the present invention is manufactured in a following manner.

Figure 9A:
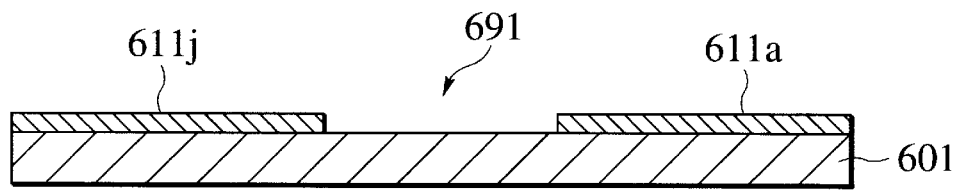
FIGS. 9A to 9D are process diagrams for showing a manufacturing method for the thin semiconductor package according to the second embodiment of the present invention.

(i) First, as the first insulating substrate (first interposer) 601, a tape-like insulating polymer film (for example, polyimide film) 601 about 75 μm thick is prepared. A Cu thin film about 18 μm thick is laminated entirely on the main surface of this insulating polymer film 601. Then, patterning is carried out according to photo-etching method so as to delineate plural patterns of the Cu wiring 12a, . . . 12j, . . . extending radiantly on the main surface of the continuous tape-like insulating polymer film 601 as shown in FIG. 9A. The patterns of the Cu wires 12a, . . . , 12j, . . . may be delineated according to the screen printing method. By this, plural sets of wiring layers, each of which has patterning of the Cu wires 12a, . . . , 12j, . . . , are disposed periodically on the main surface of the continuous tape-like insulating polymer film 601. Then, a plurality of opening portions 691, 691, 691, . . . , in which the insulating polymer film 601 are respectively exposed, are formed periodically at predetermined positions on the insulating polymer film 601. These opening portions 691, 691, 691, . . . are rectangular windows for attaching the silicon chips. In other words, it can be said that the opening portions 691, 691, 691, . . . are respectively arranged for the completed second insulating substrate (second interposer) 602, the completed third insulating substrate (third interposer) 603 and the completed fourth insulating substrate (fourth interposer) 604. However, the first to fourth insulating substrates 601, 602, 603, 604 are continuous as a continuous tape-like insulating polymer film at this stage.

Figure 9B:
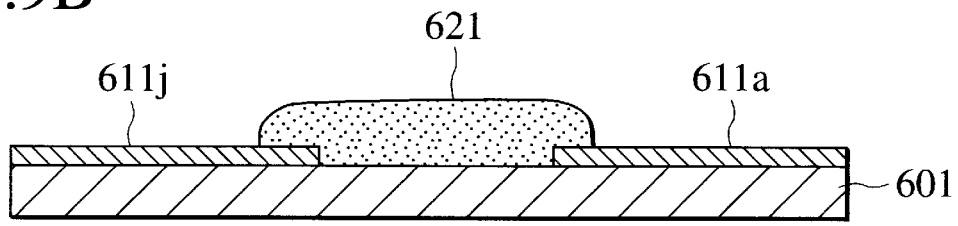

(ii) Next, as shown in FIG. 9B, resin sheets 621, 622, 623, 624, . . . made of anisotropic conductive film as connecting resin is applied selectively on the opening portions 691, . . . for attaching the silicon chip. In particular, anisotropic conductive film is mechanically punched out to form a plurality of sheets having a predetermined size. And the punched out sheets are attached corresponding chip mount regions. Instead of above punching out method, "potting method" is also employable.

Figure 9C:
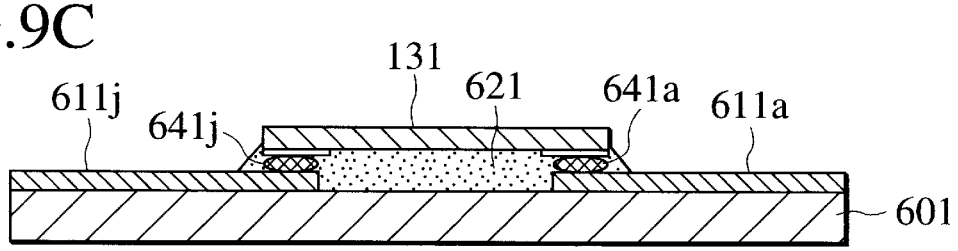

(iii) Subsequently, as shown in FIG. 9C, the positions of the Cu wire 12a, . . . , 12j, . . . the first insulating substrate (fourth interposer) 601 are aligned with the positions of the Au bumps 641a, . . . 641j. . . of the silicon chip 131 and then the silicon chip 131 is placed on the chip mount region on the continuous tape-like insulating polymer film 601. Likewise, the silicon chips 132, 133, 134 are mounted on the corresponding chip mount regions periodically arranged on the continuous tape-like insulating polymer film, or the completed insulating polymer films 602, 603, 604. After that, by heating up to about 120° C., the resin sheets 621, 622, 623, 624, . . . are melted, and then the continuous tape-like insulating polymer film 601 is kept at the temperature to cure the connecting resins 621, 622, 623, 624 . . . so that the silicon chips 131, 132, 133, 134 are fixed periodically on the continuous tape-like insulating polymer film 601 (i.e. on the completed insulating polymer films 601, 602, 603, 604).

Figure 9D:
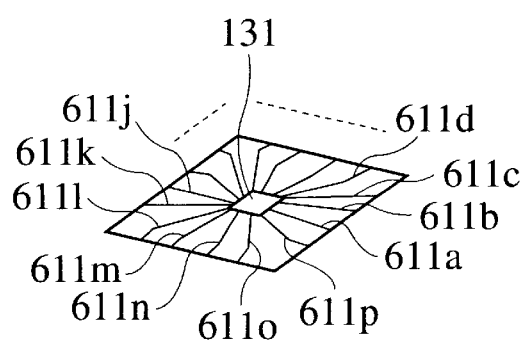

(iv) At this stage, the silicon chips 131, 132, 133, 134 are mounted in the opening portions 691, . . . disposed periodically on the continuous tape-like insulating polymer film (interposer) 601, 602, 603, 604 so that plural packages are formed continuously. Therefore, as shown in FIG. 9D, the individual interposers 601, 602, 603, 604 are separated by cutting. FIG. 9D shows the first completed interposer 601, for example. In the first interposer 601, 16 Cu wires 12a, 12b, 12c, . . . , 12j, . . . 12o, 12p extending radiantly are indicated.

(v) Then, the first to fourth completed interposers 601, 602, 603, 604 having such structures are laminated so as to assemble the MCM shown in FIG. 8B. At this time, the first connection lands 621a, . . . , 621j, . . . are connected to the package wirings 17a, . . . , 17j, . . . through the first outer-joint-conductors 651a, . . . , 651j, . . . such as solder balls. Likewise, the second connection lands 622a, . . . , 622j, . . . are connected to the first connection lands 621a, . . . , 621j, . . . through the second outer-joint-conductors 652a, . . . , 652j, . . . . The third connection lands 623a, . . . , 623j, . . . are connected to the second connection lands 622a, . . . , 622j, . . . through the third outer-joint-conductors 653a, . . . , 653j, . . . . . The fourth connection lands 624a, . . . , 624j, . . . are connected to the third connection lands 623a, . . . , 623j, . . . through the fourth outer-joint-conductors 654a, . . . , 654j, . . . .

In the stacked configuration of the second embodiment of the present invention, it is not necessary to prepare two kinds of packages, which are in the mirror symmetrical topology, unlike the stacked configuration of the first embodiment.

(Third Embodiment)

Figure 10A:
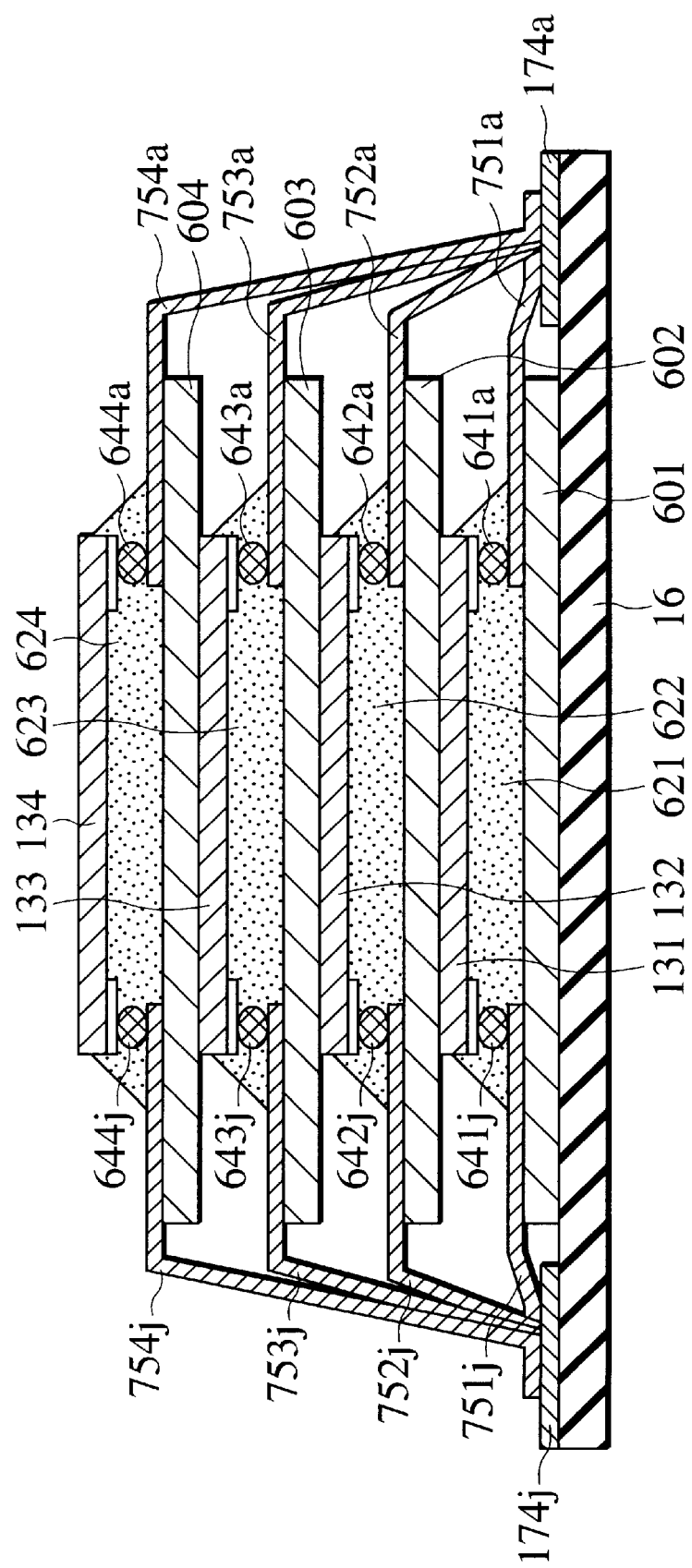
FIG. 10A is a cross sectional view of the MCM according to a third embodiment of the present invention.
Figure 10B:
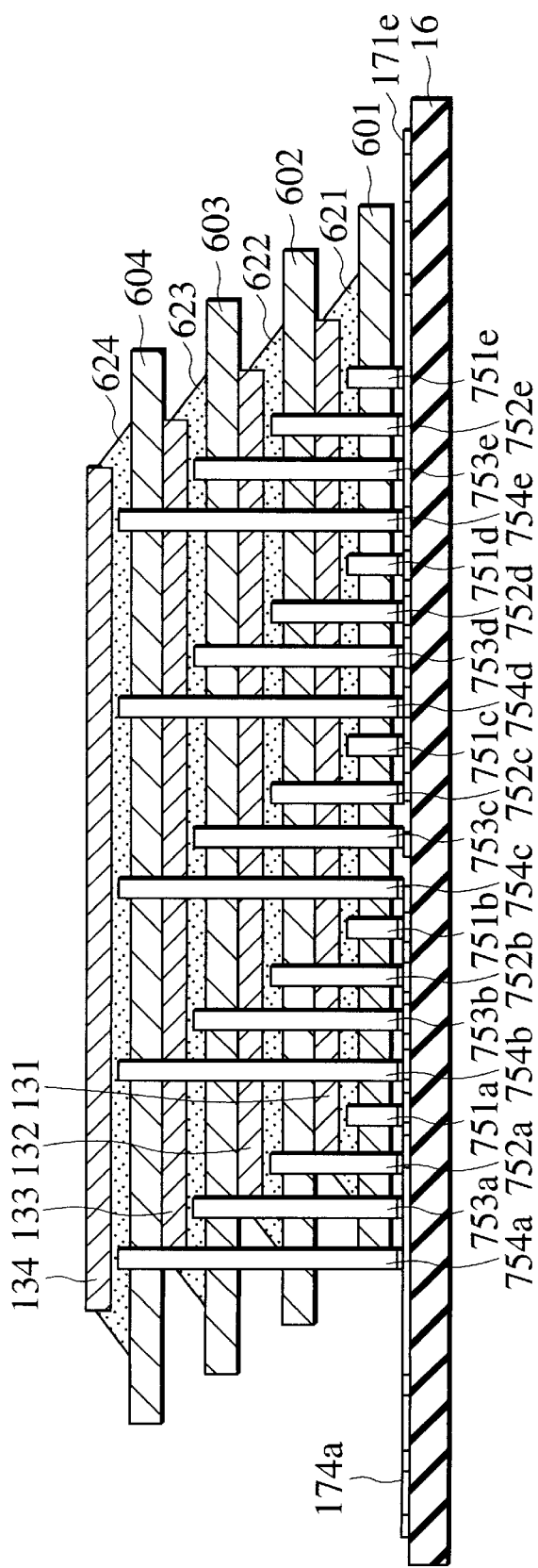
FIG. 10B is a side view, observed along a direction perpendicular to the direction of the cross-sectional plane of the FIG. 10A, showing a structure of the MCM according to the third embodiment of the present invention.
Figure 10C:
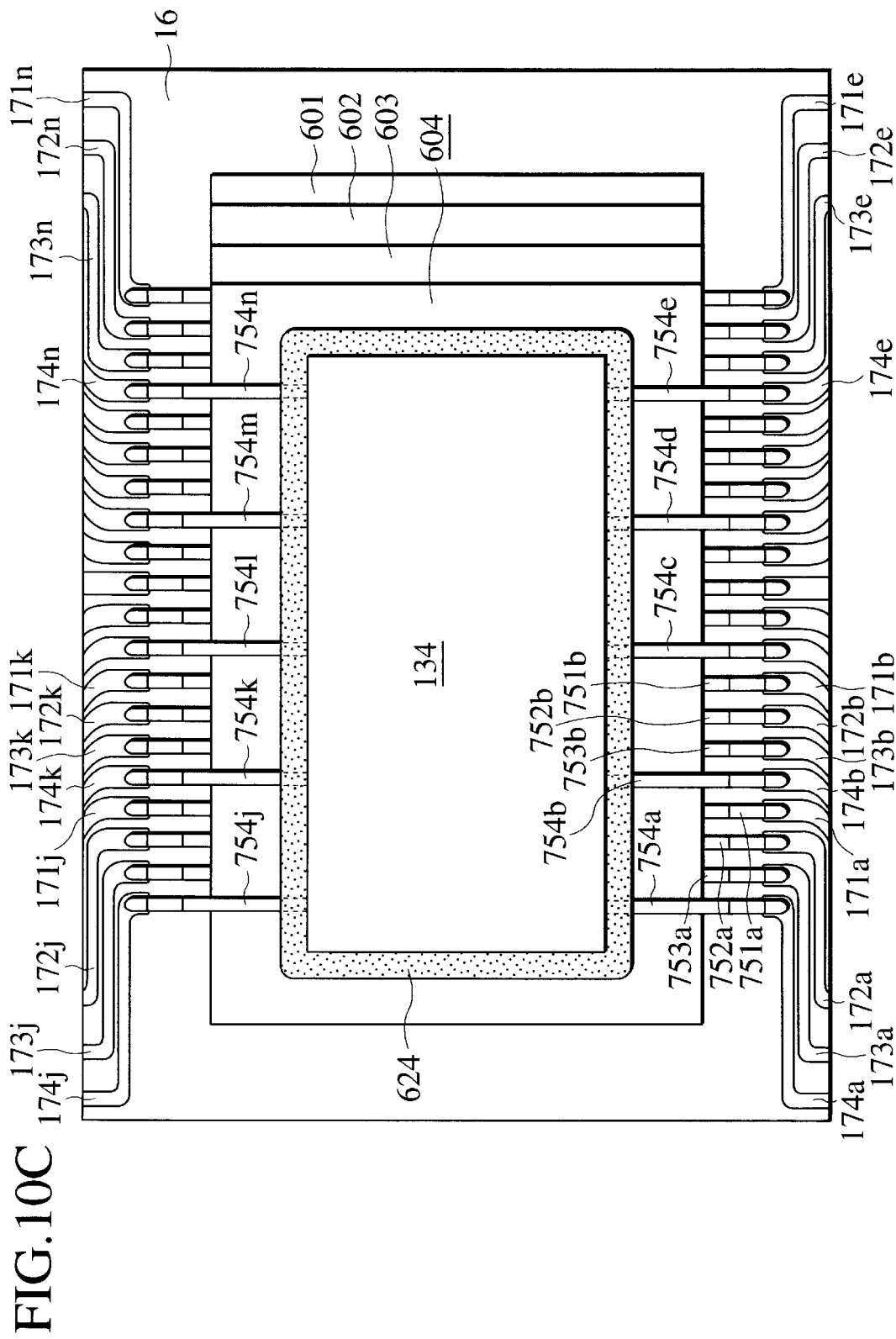
FIG. 10C is a plan view showing a structure of the MCM according to the third embodiment of the present invention.

FIGS. 10A, 10B, 10C are laminated sectional view, side view and plan view showing a structure of the MCM according to the third embodiment of the present invention. As shown in FIGS. 10A, 10B, four pieces of the packages, namely the first to fourth semiconductor packages are laminated. As shown in FIG. 10C, the MCM substrate 16 has plural package wirings 174a, 173a, 172a, 171a, 174b, 173b, 172b, 171b, . . . 174j, 173j, 172j, 171j, . . . .

Here, the first semiconductor package has a first insulating substrate (first interposer) 601, plural first wiring layers 611a, . . . , 611j, . . . disposed on the surface of the first insulating substrate 601, a first semiconductor chip 131 disposed in flip-chip orientation above the main surface of the first insulating substrate 601, first inner-joint-conductors 641a, . . . , 641j, . . . for electrically connecting at least part of the plural first bonding pads on the surface of the first conductor chip 131 to the corresponding plural first wiring layers 611a, . . . , 611j, . . . , and first sealing member 621 filled between the first insulating substrate 601 and the first semiconductor chip 131.

On the other hand, the second semiconductor package has a second insulating substrate (second interposer) 602, second semiconductor chip 132 disposed in flip-chip orientation above the main surface of the second insulating substrate 602, second inner-joint-conductors for electrically connecting the second semiconductor chip 132 to the second insulating substrate 602, and second sealing member 622 filled between the second insulating substrate 602 and the second semiconductor chip 132. The second insulating substrate 602 is shifted by a predetermined distance along a plane parallel to the surface of the first insulating substrate 601, relative to the first insulating substrate 601. Plural second wiring layers 612a, . . . , 612j, . . . electrically connected to each of the plural first wiring layers 611a, . . . , 611j, . . . are disposed on the main surface of the second insulating substrate 602. The second inner-joint-conductors electrically connect at least part of the plural second bonding pads on the surface of the second semiconductor chip 132 to the corresponding plural second wiring layers.

The third semiconductor package has a third insulating substrate (third interposer) 603, a third semiconductor chip 133 disposed in flip-chip orientation above the main surface of the third insulating substrate 603, third inner-joint-conductors for electrically connecting the third semiconductor 133 to the third insulating substrate 603 and third sealing member filled between the third insulating subtracting 603 and the third semiconductor chip 133. The third insulating substrate 603 is shifted by a predetermined distance along a plane parallel to the surface of the first insulating substrate 601, relative to the second insulating substrate 602.

Further, the fourth semiconductor package has a fourth insulating substrate (fourth interposer), a fourth semiconductor chip 134 disposed in flip-chip orientation above the main surface of the fourth insulating substrate 604, fourth inner-joint-conductors for electrically connecting the fourth insulating substrate 604 to the fourth semiconductor chip 133 and the like. The fourth insulating substrate 604 is shifted by a predetermined distance along a plane parallel to the surface of the first insulating substrate 601, relative to the third insulating substrate 603.

The Cu wiring layers 611a, . . . , 611j, . . . of the first insulating substrate (first interposer) are stretching out from the surface of the thin silicon chip 131 so that first outer leads 751a, . . . , 751j, . . . are formed. Likewise, the Cu wiring layers 612a, . . . , 612j, . . . of the second insulating substrate (second interposer) are stretching out from the surface of the thin silicon chip 132 so that second outer leads 752a, . . . , 752j, . . . are formed. Further, likewise, the Cu wiring layers 613a, . . . , 613j, . . . of the third insulating substrate (third interposer) 603 are stretching out from the surface of the thin silicon chip 133 so that third outer leads 753a, . . . , 753j, . . . are formed. Further, the Cu wiring layers 614a, . . . , 614j, . . . of the fourth insulating substrate (fourth interposer) 604 are stretching out from the surface of the thin silicon chip 134 so that fourth outer leads 754a, . . . , 754j, . . . are formed. The first outer leads 751a, . . . , 751j, . . . are connected to the package wirings 171a, 171j as shown in FIG. 10C. The second outer leads 752a, . . . , 752j, . . . are connected to the package wirings 172a, . . . , 172j, . . . . The third outer leads 753a, . . . , 753j, . . . are connected to the package wirings 173a, . . . , 173j, . . . The fourth outer leads 754a, . . . , 754j, . . . are connected to the package wirings 174a, . . . , 174j . . . .

In the MCM stacked structure of the third embodiment of the present invention also, the packages are laminated so that the upper and lower packages are shifted to each other in order to reinforce portions of the package weak in mechanical strength. As a result, as shown in FIGS. 10B, 10C, the respective outer leads 751a, . . . , 751j, . . . , 754a, . . . , 754j, . . . extending from each of the first to fourth level packages connect to the corresponding package wirings 171a, . . . , 171j, . . . , 174a, . . . , 174j, . . . delineated respectively on the MCM substrate 16, in a shifted topology.

The stacked configuration of the MCM according to the third embodiment of the present invention eliminates the necessity of preparing two kinds of mirror symmetrical packages unlike the stacked configuration according to the first embodiment.

OTHER EMBODIMENTS

Various modifications will become possible for those skilled in the art after receiving the teachings of the present disclosure without departing from the scope thereof.

It is permissible to laminate the semiconductor packages, each of which is shown in FIG. 8A, having a structure of the second embodiment, in the stacked configuration of the first embodiment, namely, such that the top and bottom surfaces of the thin semiconductor packages are inverted and predetermined electrodes are electrically connected.

Figure 11:
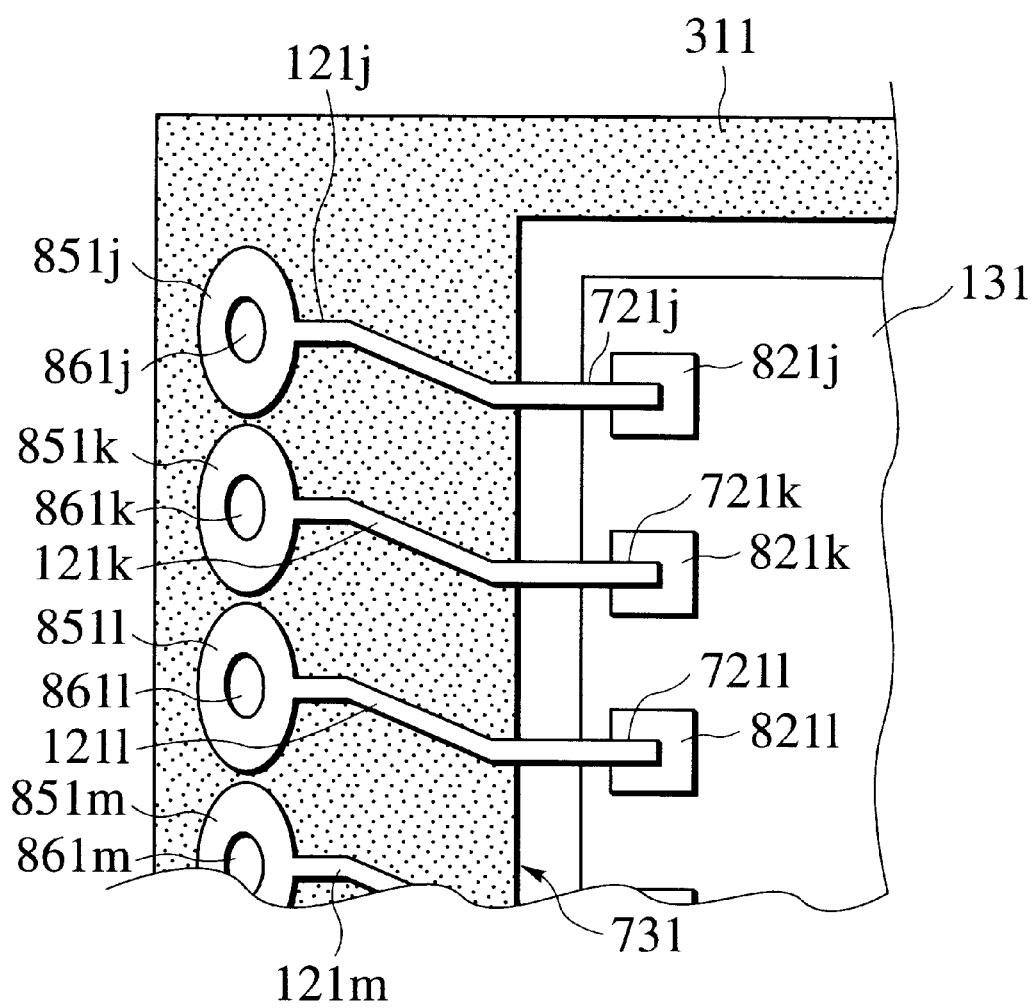
FIG. 11 is a plan view showing connection lands of the semiconductor package according to the other embodiment of the present invention.

On the contrary, it is also permissible to laminate the semiconductor packages as shown in FIG. 3A, having a structure according to the first embodiment, in the stacked configuration of the second embodiment, namely, such that they are shifted in the direction of the plane and predetermined electrodes are electrically connected to each other. In this case, it is preferable to prepare the flat oval-shaped connection lands 851j, 851k, 851l, 851m, . . . , each having major axis along the direction of the shifting, as shown in FIG. 11. And it is preferable to prepare the flat elliptical through holes 861j, 861k, 861l, 861m, . . . , which are made in the oval-shaped connection lands 851j, 851k, 851l, 851m, . . . respectively. Although not shown in the drawing, gourd-shaped connection lands can be employed instead of the oval-shaped connection lands. In case of gourd-shaped connection lands, two circular holes can be disposed in each of gourd-shaped connection lands, respectively.

Figure 7A:
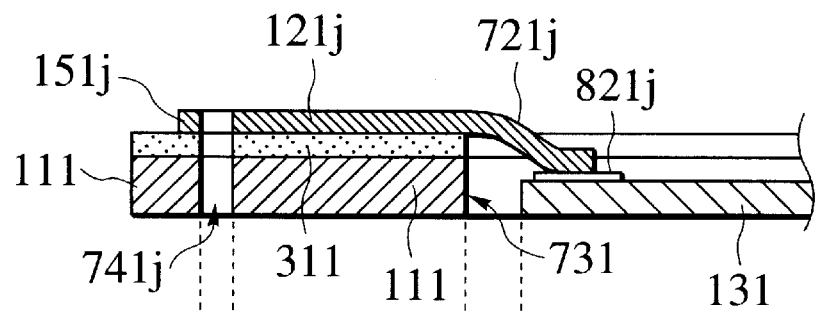
FIG. 7A is a cross sectional view showing a structure for selecting a specific silicon chip address in the semiconductor package of the first embodiment of the present invention.
Figure 7B:
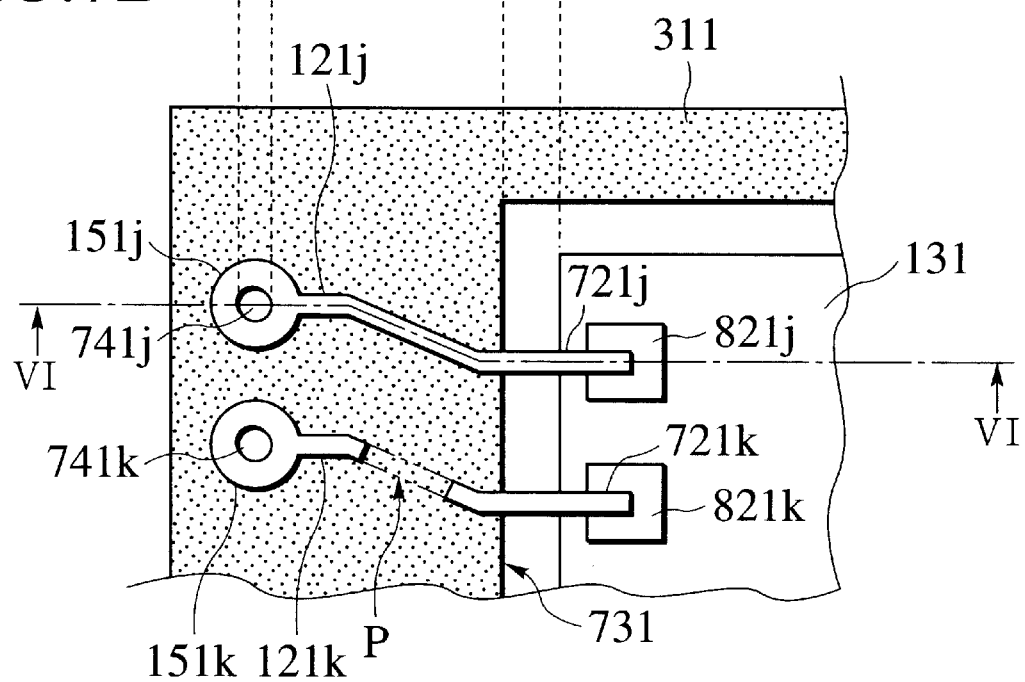
FIG. 7B is a plan view corresponding to FIG. 7A, namely

In these second, third, and above other embodiment, it is possible to cut down a specific Cu wiring, just before the lamination, so as to assign the specific address to respective semiconductor chips so that we can select one of semiconductor chips, like the above described first embodiment shown in FIGS. 7A and 7B.

Although not described, it is needless to say that various modifications are included in the present invention. Therefore, only following claims, which are appropriate from the above description, can restrict the technical scope of the present invention.

What is claimed is:
1. A semiconductor package comprising:
  (a) an insulating substrate having a device hole penetrating, with a monotonic side wall substantially vertical to a surface of the insulating substrate, through a central portion thereof;
  (b) wiring layers disposed on a surface of said insulating substrate;
  (c) a semiconductor chip thinner than said insulating substrate, having bonding pads, said semiconductor chip being disposed in said device hole such that a bottom thereof is exposed at said device hole so that the bottom level is flush with a bottom plane of said insulating substrate, and such that a top surface of the semiconductor chip does not directly contact the insulating substrate;
  (d) inner-joint-conductors for connecting at least part of said bonding pads to corresponding said wiring layers; and

(e) connection lands connected to said wiring layers.

2. A semiconductor package comprising:

an insulating substrate having a device hole penetrating through a central portion thereof;

wiring layers disposed on a surface of said insulating substrate;

a semiconductor chip thinner than said insulating substrate, having bonding pads, said semiconductor chip being disposed in said device hole such that a bottom thereof is exposed at said device hole so that the bottom level is flush with a bottom plane of said insulating substrate;

inner-joint-conductors for connecting at least part of said bonding pads to corresponding said wiring layers;

connection lands connected to said wiring layers; and a sealing resin filled in a gap between a sidewall of the device hole and said semiconductor chip configured such that a bottom thereof is flush with the bottom plane of said insulating substrate.

3. The package of claim 1, further comprising through holes formed just below said connection lands, within said insulating substrate.

4. A multi-chip module comprising:

(a) a first insulating substrate having a first device hole penetrating, with a monotonic side wall substantially vertical to a surface of the first insulating substrate, through a central portion thereof;

(b) first wiring layers disposed on a surface of said first insulating substrate;

(c) a first semiconductor chip thinner than said first insulating substrate, having first bonding pads, said first semiconductor chip being disposed in said device hole configured such that a bottom thereof is flush with a bottom plane of said first insulating substrate, and such that a top surface of the first semiconductor chip does not directly contact the first insulating substrate;

(d) first inner-joint-conductors for connecting at least part of said first bonding pads to corresponding said first wiring layers;

(e) first connection lands connected to said first wiring layers (f) a second insulating substrate having a second device hole penetrating, with a monotonic side wall substantially vertical to a surface of the second insulating substrate, through a central portion thereof, disposed above said first insulating substrate;

(g) second wiring layers disposed on a surface of said second insulating substrate;

(h) a second semiconductor chip thinner than said second insulating substrate, having second bonding pads, said second semiconductor chip being disposed in said second device hole configured such that a bottom thereof is flush with a bottom plane of said second insulating substrate, and such that a top surface of the second semiconductor chip does not directly contact the second insulating substrate;

(i) second inner-joint-conductors for connecting at least part of said second bonding pads to corresponding said second wiring layers; and (j) second connection lands connected to said second wiring layers, electrically connected to said first connection lands.

5. The multi-chip module of claim 4, further comprising a first sealing resin filled in a gap between a sidewall of said first device hole and said first semiconductor chip configured such that a bottom thereof is flush with the bottom plane of said first insulating substrate.

6. The multi-chip module of claim 5, further comprising second sealing resin filled in a gap between a sidewall of said second device hole and said second semiconductor chip configured such that a bottom thereof is flush with the bottom plane of said second insulating substrate.

7. The multi-chip module of claim 4, further comprising:

a first through hole formed just below said first connection lands, in said first insulating substrate; and a second through hole formed just above said second connection lands, in said second insulating substrate.

8. The multi-chip module of claim 7, further comprising:

first stud conductors buried in each of said first through holes; and a MCM substrate having package wirings electrically connected to said first stud conductors.

9. The multi-chip module of claim 8, further comprising:

second stud conductors buried in said second through holes;

a third insulating substrate having a third device hole, penetrating through a central portion thereof, disposed above said second insulating substrate;

third wiring layers disposed on a surface of said third insulating substrates;

a third semiconductor chip thinner than said third insulating substrate, having third bonding pads, said third semiconductor chip being disposed in said third device hole such that a bottom thereof is flush with a bottom plane of said third insulating substrate;

third inner-joint-conductors for connecting at least part of said third bonding pads to corresponding said third wiring layers;

third connection lands connected to said third wiring layers, electrically connected to said second connection lands;

third through holes formed just below said third connection lands, in said third insulating substrate; and third stud conductors buried in said third through holes, electrically connected to said second stud conductors.

10. The multi-chip module of claim 4, wherein thicknesses of said first and second insulating substrates are 30 $\mu$m–120 $\mu$m, respectively.

11. The multi-chip module of claim 4, wherein thicknesses of said first and second semiconductor chips are 10 $\mu$m–110 $\mu$m, respectively.

12. The multi-chip module of claim 4 wherein said first and second wiring layers are disposed in a mirror-symmetrically topology on the surface of said first and second insulating substrates, respectively.

13. The multi-chip module of claim 9, wherein said second and third wiring layers are disposed in a mirror-symmetrically topology on the surface of said second and third insulating substrates, respectively.

14. The multi-chip module of claim 9, wherein said second and third semiconductor chips are in contact with each other through bottom faces thereof.

15. The multi-chip module of claim 4, wherein said second insulating substrate is shifted by a predetermined distance along a plane parallel to said first insulating substrate relative thereto.

16. The multi-chip module of claim 9, wherein said third insulating substrate is shifted by a predetermined distance along a plane parallel to said second insulating substrate relative thereto.

17. A multi-chip module comprising:

(a) a first insulating substrate;

(b) first wiring layers disposed on a surface of said first insulating substrate;

(c) a first semiconductor chip having first bonding pads, disposed above a main surface of said first insulating substrate;

(d) first inner-joint-conductors for electrically connecting at least part of said first bonding pads to corresponding said first wiring layers;

(e) a first sealing member filled between said first insulating substrate and said first semiconductor chip;

(f) a second insulating substrate shifted by a predetermined distance along a plane parallel to said first insulating substrate relative thereto, having second wiring layers electrically connected to said first wiring layers on a main surface thereof;

(g) a second semiconductor chip having second bonding pads, disposed above said main surface of said second insulating substrate;

(h) second inner-joint-conductors for electrically connecting at least part of said second bonding pads to corresponding said second wiring layers; and (i) a second sealing member filled between said second insulating substrate and said second semiconductor chip.

18. The multi-chip module of claim 17, wherein thicknesses of said first and second semiconductor chips are 10 $\mu$m–150 $\mu$m, respectively.

19. The multi-chip module of claim 17, wherein thicknesses of said first and second insulating substrates are 30 $\mu$m–100 $\mu$m, respectively.

20. The multi-chip module of claim 17, wherein a thickness of said semiconductor chip is 30 $\mu$m–120 $\mu$m.

21. The package of claim 1, wherein a thickness of said package is 120 $\mu$m–200 $\mu$m.

* * * * *